(12) United States Patent
Ide et al.

(10) Patent No.: US 7,480,122 B2
(45) Date of Patent: Jan. 20, 2009

(54) MAGNETIC DETECTING DEVICE HAVING FREE LAYER OR PINNED LAYER FORMED BY LAMINATION OF MAGNETIC ALLOY AND CU LAYER AND METHOD OF MANUFACTURING MAGNETIC DETECTING DEVICE

(75) Inventors: Yosuke Ide, Niigata-ken (JP); Masamichi Saito, Niigata-ken (JP); Masahiko Ishizone, Niigata-ken (JP); Naoya Hasegawa, Niigata-ken (JP); Kazumasa Nishimura, Niigata-ken (JP)

(73) Assignee: TDK Corporation, Tokyo (JP)

( * ) Notice: Subject to any disclaimer, the term of this patent is extended or adjusted under 35 U.S.C. 154(b) by 415 days.

(21) Appl. No.: 11/365,559

(22) Filed: Feb. 28, 2006

(65) Prior Publication Data
US 2006/0203396 A1   Sep. 14, 2006

(30) Foreign Application Priority Data
Mar. 2, 2005   (JP)   ............................. 2005-057597

(51) Int. Cl.
   *G11B 5/127*   (2006.01)
(52) U.S. Cl. ................................. 360/324.12
(58) Field of Classification Search ............. 360/324.12
   See application file for complete search history.

(56) References Cited
U.S. PATENT DOCUMENTS
2003/0137785 A1   7/2003   Saito 2008/0124581 A1*  5/2008   Miura et al. ............. 428/811.1

FOREIGN PATENT DOCUMENTS

| JP | 2002-150512 | 5/2002 |
| JP | 2003-008102 | 1/2003 |
| JP | 2004-214251 | 7/2004 |
| WO | WO 02/088765 | 11/2002 |

OTHER PUBLICATIONS

Search Report dated Jun. 7, 2006, for corresponding British Patent Application No. 0602490.5.
Growth and Magnetic Properties of Single Crystal Co2 MnX (X×Si, Ge), S.F. IEEE Transactions on Magnetics, vol. 37, No. 4, Jul. 2001.
Search Report dated Jun. 7, 2006, for corresponding British Patent Application No. 0602490.5.

* cited by examiner

*Primary Examiner*—Allen T Cao
(74) *Attorney, Agent, or Firm*—Brinks Hofer Gilson & Lione

(57) ABSTRACT

A magnetic detecting device and a method of manufacturing the magnetic detecting device are provided. Non-magnetic material layer-side magnetic layers of second fixed magnetic layers form a fixed magnetic layer. Each of the non-magnetic material layer-side magnetic layers and a free magnetic layer is formed of a layer, for example, a CoMnGeCu layer. In the CoMnGeCu layer, a bulk scattering coefficient may become larger, as compared with a CoMnGe layer. As a result, it is possible to increase the product between a magnetoresistance variation and a device area. Further, the ferromagnetic coupling magnetic field can be decreased. The Cu is added by a range which is larger than 0 at. % and not more than 17.5 at. % (average composition ratio).

19 Claims, 8 Drawing Sheets

MAGNETIC DETECTING DEVICE HAVING FREE LAYER OR PINNED LAYER FORMED BY LAMINATION OF MAGNETIC ALLOY AND CU LAYER AND METHOD OF MANUFACTURING MAGNETIC DETECTING DEVICE

BACKGROUND OF THE INVENTION

1. Field of the Invention

The present invention relates to a magnetic detecting device having fixed magnetic layers and a free magnetic layer, in which a magnetization direction of the fixed magnetic layers is fixed to be oriented in a particular direction, and the free magnetic layer is formed between the fixed magnetic layers via non-magnetic material layers and the magnetization direction of the free magnetic layer varies by an external magnetic field. More particularly, the present invention relates to a magnetic detecting device which is capable of increasing the product ΔRA between a magnetoresistance variation ΔR and a device area A and decreasing a ferromagnetic coupling magnetic field $H_{in}$.

2. Description of the Related Art

A magnetic detecting device has a multilayered film in which a free magnetic layer, a non-magnetic material layer, and fixed magnetic layers are laminated. In such a magnetic detecting device, there are two kinds in accordance with a difference of a current direction with respect to the multilayered film, that is, a CIP (current in the plane) type and a CPP (current perpendicular to the plane) type.

In the CIP-type magnetic detecting device, a current flows in a parallel direction to a film surface of the multilayered film. In contrast, in the CPP-type magnetic detecting device, a current flows in a perpendicular direction to the film surface of the multilayered film.

The CPP-type magnetic detecting device has an advantage in that it has a device size smaller than that of the CIP-type magnetic detecting device and increases a reproducing output. Accordingly, the CPP-type magnetic detecting device has been expected as a magnetic detecting device which can substitute for the CIP-type magnetic detecting device having been widely used and achieve a high recording density.

In the meantime, in order to allow to be put to practical use the CPP-type magnetic detecting device capable of achieving the high recording density in future, it is required to increase the product ΔRA between a magnetoresistance variation ΔR and a device area A.

Each of JP-A-2003-8102, JP-A-2002-150512, and JP-A-2004-214251 discloses a method of increasing the product ΔRA between a magnetoresistance variation ΔR and a device area A in a CPP-type magnetic detecting device.

According to a method disclosed in JP-A-2003-8102, a resistance adjusting layer is provided between a magnetization fixed layer (fixed magnetic layer) and a non-magnetic intermediate layer (non-magnetic material layer). A forming material of the resistance adjusting layer is described in claim 6 or the like in JP-A-2003-8102. Further, according to a method disclosed in JP-A-2002-150512, a free layer (free magnetic layer) is formed with a laminated structure of a thin film and a non-magnetic layer. Furthermore, according to a method disclosed in JP-A-2004-214251, unlike a fixed magnetic layer or a free layer, an inserting layer containing a semimetal is separately provided.

Although various mechanisms have been made for increasing ΔRA by using various methods including the above-mentioned methods, there is no structure which it is possible to effectively increase ΔRA such that the method can be put to practical use.

Further, in order to allow to be put to practical use the CPP-type magnetic detecting device capable of achieving the high recording density in future, it is required to decrease a ferromagnetic coupling magnetic field $H_{in}$, in addition to the increasing the ΔRA.

Since the ferromagnetic coupling magnetic field $H_{in}$ is generated by the magnetostatic coupling between the fixed magnetic layer and the free magnetic layer (topological coupling), it causes a problem such that the ferromagnetic coupling magnetic field becomes stronger, and an asymmetry of a reproducing waveform is increased.

SUMMARY OF THE INVENTION

The present invention has been made to solve the conventional problem, and it is an object of the invention to provide a magnetic detecting device which is capable of increasing the product ΔRA between a magnetoresistance variation ΔR and a device area A and decreasing a ferromagnetic coupling magnetic field $H_{in}$, and a method of manufacturing a magnetic detecting device.

According to a first aspect of the invention, there is provided a magnetic detecting device which includes: fixed magnetic layers whose magnetization direction is fixed; and a free magnetic layer which is formed between the fixed magnetic layer via non-magnetic material layers and whose magnetization direction varies by an external magnetic field. At least one of the fixed magnetic layers and the free magnetic layer has a magnetic alloy layer whose composition formula is represented as $X_a Y_b Z_c \alpha_d$. Further, a composition ratio d of the element α is within a range which is greater than 0 at. % and not more than 17.5 at. %.

Furthermore, the element X is at least one element selected from a group consisting of Co, Rh, Pt, Au, Pd, Ir, Ru, Ag, Zn, Cd and Fe, the element Y is at least one element selected from a group consisting of Mn, Fe, Ti, V, Zr, Nb, Hf, Ta, Cr, and Co, the element Z is at least one element selected from a group consisting of Al, Sn, In, Sb, Ga, Si, Ge, Pb, and Zn, and the element a is Cu and/or Ni, and a, b, c, and d indicate average composition ratios (at. %) in the magnetic alloy layer and satisfy a relationship of a+b+c+d=100 at. %.

According to this aspect, in at least one of the fixed magnetic layers and the free magnetic layer, a magnetic alloy layer is formed by adding to the elements X, Y, and Z the element α by a range which is larger than 0 at. % and not more than 17.5 at. % (average composition ratio), so that a bulk scattering coefficient β can be increased, as compared with a case in which a magnetic alloy layer is formed by using only the elements X, Y, and Z. As a result, it is possible to increase the product ΔRA between a magnetoresistance variation ΔR and a device area A. In experiments which will be described in detail below, it can be confirmed that the average composition ratio of the element α is set within a range which is larger than 0 at. % and not more than 17.5 at. %, and thus ΔR can be increased as compared with a case in which the element α is not contained. Further, the ferromagnetic coupling magnetic field $H_{in}$ can be decreased.

Preferably, the composition ratio d of the element α is within a range of 5.0 to 15.0 at. %. According to experiments which will be described in detail below, it can be confirmed that the average composition ratio of the element α is adjusted within the above-mentioned range, and thus very large ΔRA can be obtained.

Preferably, a composition of the element α contained in the magnetic alloy layer is varied in a thickness direction of the magnetic alloy layer. Specifically, preferably, the magnetic alloy layer has a region that has a composition ratio of the element α larger than a composition ratio of the element α in each of a top surface and a bottom surface of the magnetic alloy layer. Further, a region where a composition ratio of the element α increases toward a top surface of the magnetic alloy layer from a bottom surface, and a region where a composition ratio of the element α decreases toward the top surface of the magnetic alloy layer from the bottom surface alternately appear. According to the film structure, in the region having the high composition ratio of the element α, downspin may be easily scattered, and thus spin-dependent interface scattering may be increased. Therefore, it is possible to effectively increase ΔRA. However, in embodiments of the invention, the element α may be diffused in the magnetic alloy layer without being densely concentrated into specific portions.

Preferably, the composition ratios a, b, and c satisfy a relationship of 2:1:1.

Preferably, the magnetic alloy layer is a $(Co_2MnGe)_b Cu_d$ layer.

Preferably, the magnetic alloy layer is formed on the interfaces which come into contact with at least the non-magnetic material layers. Therefore, the ferromagnetic coupling magnetic field $H_{in}$ can be more properly decreased.

Preferably, the fixed magnetic layers is formed as a laminated structure of a first fixed magnetic layer, a non-magnetic intermediate layer, respectively, the second fixed magnetic layer comes into contact with the non-magnetic material layer, the second fixed magnetic layer is formed as a non-magnetic intermediate layer-side magnetic layer and a non-magnetic material layer-side magnetic layer, and the non-magnetic material layer-side magnetic layer is formed as the magnetic alloy layer. Since the fixed magnetic layer has a structure called a laminated ferrimagnetic structure, the magnetization direction of the fixed magnetic layer can be firmly fixed. However, in order that the RKKY-like interaction is effectively generated between the first fixed magnetic layer and the second fixed magnetic layer, the second fixed magnetic layer is formed as a laminated structure of the non-magnetic intermediate layer-side magnetic layer and the non-magnetic material layer-side magnetic layer, and each of the first fixed magnetic layer and the non-magnetic intermediate layer-side magnetic layer is formed of a magnetic material, such as a CoFe alloy or the like. In the meantime, the non-magnetic material layer-side magnetic layer is formed of the magnetic alloy layer according to the embodiment of the invention so as to increase ΔRA.

Preferably, the magnetic detecting device further includes antiferromagnetic layers that are provided at the sides of the fixed magnetic layers opposite to the non-magnetic material layers so as to fix the magnetization direction of each of the fixed magnetic layers by means of an exchange coupling anisotropy magnetic field generated between the antiferromagnetic layer and the fixed magnetic layer.

Preferably, the magnetic detecting device may include non-magnetic material layers that are laminated over and under the free magnetic layer, respectively; and fixed magnetic layers that are provided over one of the non-magnetic material layers and under the other of the non-magnetic material layers, respectively. Preferably, the magnetic detecting device further includes antiferromagnetic layers that are provided over the one fixed magnetic layer and under the other fixed magnetic layer and fix a magnetization direction of each of the fixed magnetic layers to a predetermined direction by means of an exchange anisotropy magnetic field.

Preferably, a sense current flows in a direction perpendicular to a surface of each of the fixed magnetic layers, the non-magnetic material layers, and the free magnetic layer. Further, the magnetic detecting device having this structure can be used for the CPP-type magnetic detecting device.

According to another aspect of the invention, there is provided a method of manufacturing a magnetic detecting device which includes fixed magnetic layers whose magnetization direction is fixed, and a free magnetic layer which is formed between the fixed magnetic layers via a non-magnetic material layers and whose magnetization direction varies by an external magnetic field. At least a portion of the fixed magnetic layers and/or the free magnetic layer is formed of a magnetic alloy layer whose composition formula is represented as $X_a Y_b Z_c α_d$ and whose a composition ratio d of the element α is within a range which is greater than 0 at. % and not more than 17.5 at. %.

Preferably, the element X is at least one element selected from a group consisting of Co, Rh, Pt, Au, Pd, Ir, Ru, Ag, Zn, Cd and Fe, the element Y is at least one element selected from a group consisting of Mn, Fe, Ti, V, Zr, Nb, Hf, Ta, Cr, and Co, the element Z is at least one element selected from a group consisting of Al, Sn, In, Sb, Ga, Si, Ge, Pb, and Zn, and the element a is Cu and/or Ni, and a, b, c, and d indicate average composition ratios (at. %) in the magnetic alloy layer and satisfy a relationship of a+b+c+d=100 at. %.

However, in at least one of the fixed magnetic layer and the free magnetic layer, a magnetic alloy layer is formed by adding to the elements X, Y, and Z the element a by a range which is larger than 0 at. % and not more than 17.5 at. % (average composition ratio), so that a bulk scattering coefficient β can be increased, as compared with a case in which a magnetic alloy layer is formed by using the elements X, Y, and Z. As a result, it is possible to increase the product ΔRA between a magnetoresistance variation ΔR and a device area A.

Preferably, the magnetic alloy layer is formed by providing a laminated structure in which intermediate layers containing the element α are interposed among a plurality of magnetic layers each of which a composition ratio is represented as $X_2YZ$ or XYZ. Therefore, the magnetic alloy layer containing the element α can be formed by a simple manufacturing method without changing manufacturing facilities.

Preferably, the intermediate layer is formed with a thickness of 1 Å to 6 Å. Preferably, when the free magnetic layer is formed as the laminated structure of the magnetic layers and the intermediate layers, each of the magnetic layers is formed with a thickness of 10 Å to 35 Å, and the number of the magnetic layers is within a range of 3 to 8.

Preferably, the fixed magnetic layer is formed as a laminated structure of a first fixed magnetic layer, a non-magnetic intermediate layer, and a second fixed magnetic layer, the second fixed magnetic layer and the non-magnetic material layer are formed so as to contact each other, and the second fixed magnetic layer is formed as a non-magnetic intermediate layer-side magnetic layer and a non-magnetic material layer-side magnetic layer. Further, preferably, when the non-magnetic material layer-side magnetic layer is formed as a magnetic alloy layer having the laminated structure of the magnetic layer and the intermediate layer, each of the magnetic layers is formed with a thickness of 10 Å to 20 Å, and the number of the magnetic layers is within a range of 2 to 4. According to the experiment result which will be described in detail below, it could be apprehended that by using the above-mentioned method, a larger ΔRA can be obtained, and the ferromagnetic coupling magnetic field $H_{in}$ can be decreased.

Preferably, after forming the laminated structure of the magnetic layers and the intermediate layers, a heat treatment is performed. Therefore, the element α and the magnetic layer represented as $X_2YZ$ or XYZ diffuse from each other so as to properly form a magnetic alloy layer whose composition formula is represented as $X_a Y_b Z_c α_d$.

In at least one of the fixed magnetic layer and the free magnetic layer, a magnetic alloy layer is formed by adding to the elements X, Y, and Z the element a by a range which is larger than 0 at. % and not more than 17.5 at. % (average composition ratio), so that a bulk scattering coefficient β can be increased, as compared with a case in which a magnetic alloy layer is formed by using the elements X, Y, and Z. As a result, it is possible to increase the product ΔRA between a magnetoresistance variation ΔR and a device area A.

DESCRIPTION OF THE PREFERRED EMBODIMENTS

Figure 1:
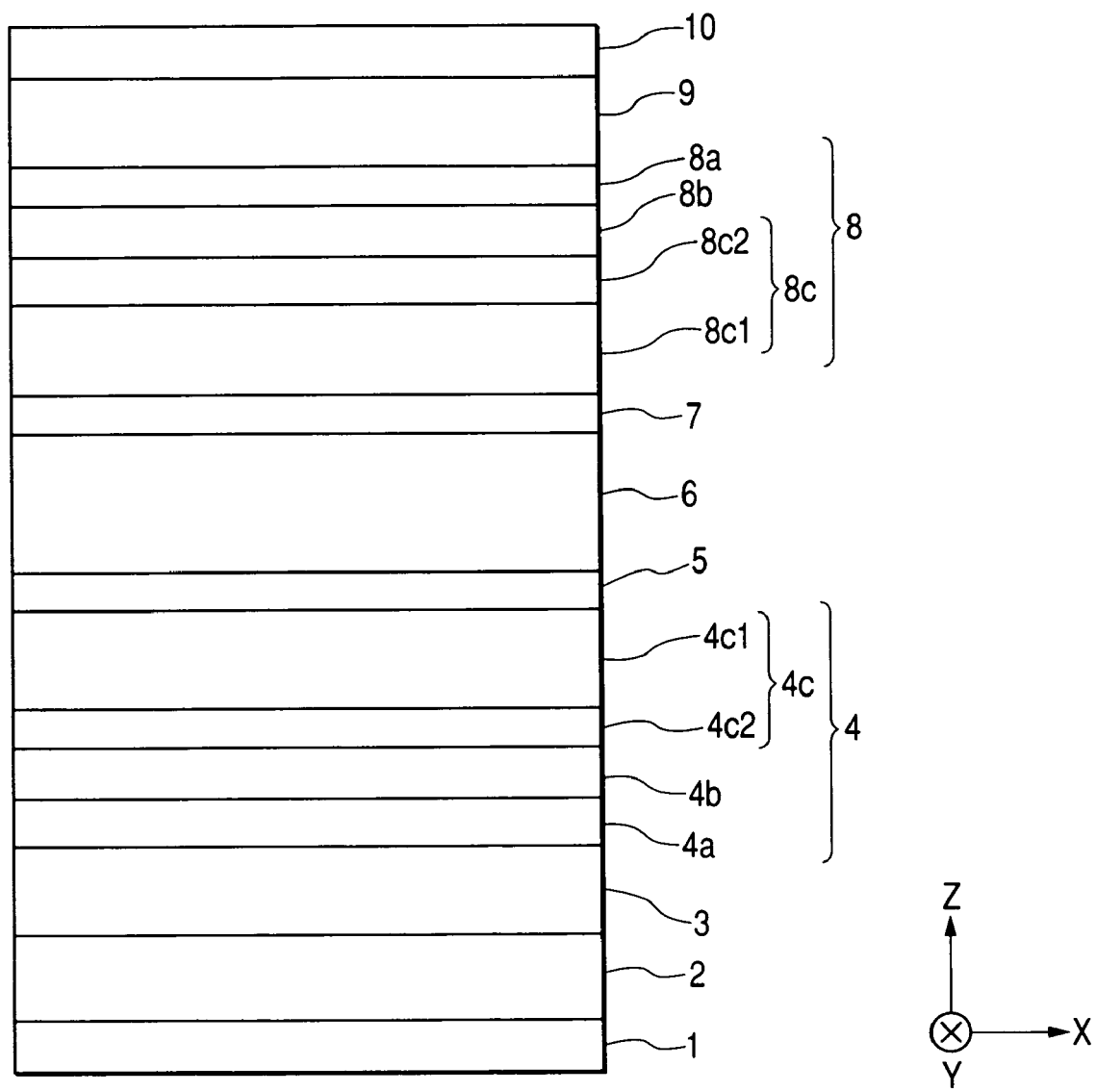
FIG. 1 is a diagram schematically illustrating a structure of a magnetic detecting device (dual spin-valve thin film device) according to a first embodiment of the invention as viewed from a facing surface side of a recording medium.

FIG. 1 is a diagram schematically illustrating a laminated structure of a CPP-type dual spin-valve thin-film device according to a first embodiment of the invention.

This dual spin-valve thin-film device is typically disposed at the trailing end face of a floating slider provided in a hard disk device and detects the recorded magnetic field of the hard disk or the like. Further, a magnetic recording medium such as the hard disk or the like moves in a Z direction, and a direction of a leakage magnetic field from the magnetic recording medium is a Y direction.

A bottom layer of FIG. 1 is a base layer 1 made of a non-magnetic material containing at least one element selected from a group consisting of Ta, Hf, Nb, Zr, Ti, Mo, and W. A seed layer 2 is provided on the base layer 1. The seed layer 2 is formed of a material containing NiFeCr or Cr. If the seed layer 2 is formed of a material containing NiFeCr, the seed layer 2 has a face-centered cubic (fcc) structure in which it is provided to preferentially align one of the crystallographically identical planes generically described as {111} planes of the seed layer 2 in a direction parallel to a layer surface. If the seed layer 2 is formed of a material containing Cr, the seed layer 2 has a body-centered cubic (bcc) structure in which it is provided to preferentially align one of the crystallographically identical planes generically described as {110} planes of the seed layer 2 in a direction parallel to a layer surface.

Further, the base layer 1, which has a structure similar to an amorphous structure, is provided, but the base layer 1 may not be formed.

An antiferromagnetic layer 3 is formed on the seed layer 2. Preferably, the antiferromagnetic layer 3 is made of antiferromagnetic materials containing manganese (Mn) and an element X (in this case, X is at least one element selected from a group consisting of Pt, Pd, Ir, Rh, Ru, and Os).

The X—Mn alloy containing at least one platinum group element has a number of excellent characteristics as an antiferromagnetic material, such as superior corrosion resistance and a high blocking temperature. In addition, the X—Mn alloy is also capable of generating a strong exchange coupling magnetic field (Hex).

Alternatively, the antiferromagnetic layer 3 may be made of antiferromagnetic materials containing elements of X, X', and Mn. In this case, the element X' is at least one element selected from a group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare earth elements.

At. % of the element X or X+X' of the antiferromagnetic layer 3 is preferably within a range of 45 to 60 (at. %), and more preferably within a range of 49 to 56.5 (at. %). As a result, in a film forming step, the interface between the antiferromagnetic layer 3 and the lower fixed magnetic layer 4 may enter a mismatching state, and a regular transformation may occur in the antiferromagnetic layer 3 by means of a heat treatment.

The lower fixed magnetic layer 4 has a multilayered structure in which it includes a first fixed magnetic layer 4a, a non-magnetic intermediate layer 4b, and a second fixed magnetic layer 4c. The magnetization vectors of the first fixed magnetic layer 4a and the second fixed magnetic layer 4c are antiparallel to each other by means of the exchange coupling magnetic field generated at the interface between the antiferromagnetic layer 3 and the lower fixed magnetic layer 4 and the antiferromagnetic exchange coupling magnetic field (RKKY-like interaction) through the non-magnetic intermediate layer 4b. This structure is called a so-called 'laminated ferromagnetic structure'. By employing such a structure, the magnetization of the lower fixed magnetic layer 4 can be stabilized and the exchange coupling magnetic field generated at the interface between the lower fixed magnetic layer 4 and the antiferromagnetic layer 3 can be increased.

However, the lower fixed magnetic layer 4 may be made of only the second fixed magnetic layer 4c so as not to be formed with the laminated ferrimagnetic structure.

In addition, the thickness of the first fixed magnetic layer 4a is within a range of, for example, 15 Å to 35 Å. The thickness of the non-magnetic intermediate layer 4b is within a range of 8 Å to 10 Å, and the thickness of the second fixed magnetic layer 14c is within a range of 20 Å to 60 Å.

The first fixed magnetic layer 4a is formed of a ferromagnetic material, such as CoFe, NiFe, CoFeNi, or the like. In addition, the non-magnetic intermediate layer 4b is formed of a non-magnetic conductive material, such as Ru, Rh, Ir, Cr, Re, Cu, or the like.

The second fixed magnetic layer 4c has a two-layered structure in which it includes a non-magnetic material layer-side magnetic layer 4c1 coming into contact with the non-magnetic material layer 5 and a non-magnetic intermediate layer-side magnetic layer 4c2.

The non-magnetic material layer 5 is formed on the fixed magnetic layer 4. The non-magnetic material layer 5 is formed of a material containing an element of Cu, Au, or Ag. The non-magnetic material layer 5, which is formed of a material containing an element of Cu, Au, or Ag, has a face-centered cubic (fcc) structure in which one of the crystallographically identical planes generically described as the {111} planes is preferentially aligned in a direction parallel to the layer surface.

A free magnetic layer 6 is formed on the non-magnetic material layer 5. A non-magnetic material layer 7 is formed on the free magnetic layer 6 by using a material selected from forming materials of the above-described non-magnetic material layer 5. Next, an upper fixed magnetic layer 8 is formed on the non-magnetic material layer 7. The upper fixed magnetic layer 8 has a laminated ferrimagnetic structure in which a second fixed magnetic layer 8c, a non-magnetic intermediate layer 8b, and a first fixed magnetic layer 8a are sequentially laminated from the bottom. The forming material of each of the first fixed magnetic layer 8a, the non-magnetic intermediate layer 8b, and the second fixed magnetic layer 8c is selected from the materials used in the first fixed magnetic layer 4a, the non-magnetic intermediate layer 4b, and the second fixed magnetic layer 4c. Further, similar to the second fixed magnetic layer 4c, the second fixed magnetic layer 8c has a two-layered structure in which it includes a non-magnetic material layer-side magnetic layer 8c1 coming into contact with the non-magnetic material layer 7 and a non-magnetic intermediate layer-side magnetic layer 8c2. In addition, the upper fixed magnetic layer 8 may be made of only the second fixed magnetic layer 8c.

Next, an upper antiferromagnetic layer 9 is formed on the upper fixed magnetic layer 8. The forming material of the upper antiferromagnetic layer 9 is selected from the materials used for the lower antiferromagnetic layer 2. Next, a protective layer 10 made of Ta or the like is formed on the upper antiferromagnetic layer 9.

The free magnetic layer 6 is magnetized in a direction parallel to a track width direction (X direction in the drawing). In the meantime, the first fixed magnetic layers 4a and 8a and the second fixed magnetic layers 4c and 8c, which form the fixed magnetic layers 4 and 8, respectively, are magnetized in a direction parallel to a direction a heightwise direction (Y direction in the drawing). Since each of the fixed magnetic layers 4 and 8 has a laminated ferrimagnetic structure, the first fixed magnetic layers 4a and 8a and the second fixed magnetic layers 4c and 8c are magnetized in an antiparallel state.

According to the characteristics of the invention, each of the non-magnetic material layer-side magnetic layers 4c1 and 8c1, which form the fixed magnetic layers 4 and 8, respectively, and the free magnetic layer 6 is formed of a magnetic alloy layer whose composition formula is represented as $X_aY_bZ_c\alpha_d$ and a composition ratio d of an element $\alpha$ is within a range which is greater than 0 at. % and not more than 17.5 at. %.

In this case, the element X is at least one element selected from a group consisting of Co, Rh, Pt, Au, Pd, Ir, Ru, Ag, Zn, Cd, and Fe, the element Y is at least one element selected from a group consisting of Mn, Fe, Ti, V, Zr, Nb, Hf, Ta, Cr, and Co, and the element Z is at least one element selected from a group consisting of Al, Sn, In, Sb, Ga, Si, Ge, Pb, and Zn. The element $\alpha$ is Cu and/or Ni, and reference characters a, b, c, and d indicate average composition ratios (at. %) within the magnetic alloy layer and satisfy a relationship of a+b+c+d=100 at. %.

The magnetic alloy layer having the composition formula of $X_aY_bZ_c\alpha_d$ is an alloy obtained by adding an element $\alpha$ to a Heusler alloy having a composition formula of, for example, $X_2YZ$ or $XYZ$. Preferably, the magnetic alloy layer has a crystal structure of an $L_{21}$ type.

Since each of the non-magnetic material layer-side magnetic layers 4c1 and 8c1 and the free magnetic layer 6 is formed as the magnetic alloy layer whose composition formula is represented as $X_aY_bZ_c\alpha_d$, a bulk scattering coefficient or the like increases. As a result, the product $\Delta RA$ between a magnetoresistance variation $\Delta R$ and a device area A (hereinafter, simply referred to as $\Delta RA$) increases. In addition, a ferromagnetic coupling magnetic field $H_{in}$ generated by magnetostatic coupling (topological coupling) between each of the fixed magnetic layers 4 and 8 and the free magnetic layer 6 can be decreased.

In the meantime, preferably, each of the non-magnetic intermediate layer-side magnetic layers 4c2 and 8c2 is not formed of a magnetic alloy layer whose composition formula is represented as $X_aY_bZ_c\alpha_d$ but formed of a ferromagnetic material, such as an alloy of CoFe, an alloy of NiFe, an alloy of CoFeNi, or the like. The non-magnetic intermediate layer-side magnetic layers 4c2 and 8c2 serve to generate the antiferromagnetic exchange coupling magnetic field (RKKY-like interaction) between the non-magnetic intermediate layer-side magnetic layers 4c2 and 8c2 and the first fixed magnetic layers 4a and 8a so as to firmly fix the first fixed magnetic layers 4a and 8a and the second fixed magnetic layers 4b and 8b. However, if each of the non-magnetic intermediate layer-side magnetic layers 4c2 and 8c2 is formed of the magnetic alloy layer whose composition formula is represented as the above-described $X_aY_bZ_c\alpha_d$, since the antiferromagnetic exchange coupling magnetic field becomes weak, each of the non-magnetic intermediate layer-side magnetic layers 4c2 and 8c2 is made of of a ferromagnetic material, such as an alloy of CoFe, an alloy of NiFe, an alloy of CoFeNi, or the like, and the strong RKKY-like interaction is generated between the non-magnetic intermediate layer-side magnetic layers 4c2 and 8c2 and the first fixed magnetic layers 4a and 8a.

Preferably, a magnetic alloy layer, which forms each of the non-magnetic material layer-side magnetic layers 4c1 and 8c1 and the free magnetic layer 6, has the following composition formula.

1. A magnetic alloy layer whose composition formula is represented as $Co_aY_bZ_c\alpha_d$. In this case, the element Y is at least one element selected from a group consisting of Mn, Fe, and Cr, and the element Z is at least one element selected from a group consisting of Al, Ga, Si, and Ge.

2. A magnetic alloy layer whose composition formula is represented as $Co_aMn_bZ_c\alpha_d$. In this case, the element Z is Si or Ge.

3. A magnetic alloy layer whose composition formula is represented as $Co_aMn_bGe_c\alpha_d$.

4. A magnetic alloy layer whose composition formula is represented as $Co_aMn_bGe_cCu_d$.

Preferably, an average composition ratio a is within a range of 40 to 50 at. %, an average composition ratio b is within a range of 20 to 25 at. %, and an average composition ratio c is within a range of 20 to 25 at. %. In addition, according to the embodiments of the invention, preferably, the composition ratio a: the composition ratio b: the composition ratio c satisfies the relationship of 2:1:1.

The Heusler alloy whose composition formula is represented as $X_2YZ$ or $XYZ$ has a ferromagnetic property by the composition. Further, the Heusler alloy is a half-metallic material of which the spin polarizability is large and in which almost all the conductive electrons are made of only either upspin electrons or downspin electrons. For this reason, even though a material containing $Co_2MnGe$ is used as a forming material of each of the free magnetic layer 6 and non-magnetic material layer-side magnetic layers 4c1 and 8c1, ΔRA can be increased, as compared with a case of using, for example, an alloy of CoFe. However, in this case, ΔRA can be increased up to only about 9 mΩμm². In contrast, according to the embodiment of the invention, it is possible to effectively increase ΔRA by adding an element α, as compared with the related art.

In the meantime, it is considered that the composition of the element α varies in a film thickness direction (Z direction in the drawing) in the free magnetic layer 6 or the non-magnetic material layer-side magnetic layers 4c1 and 8c1.

Figure 3:
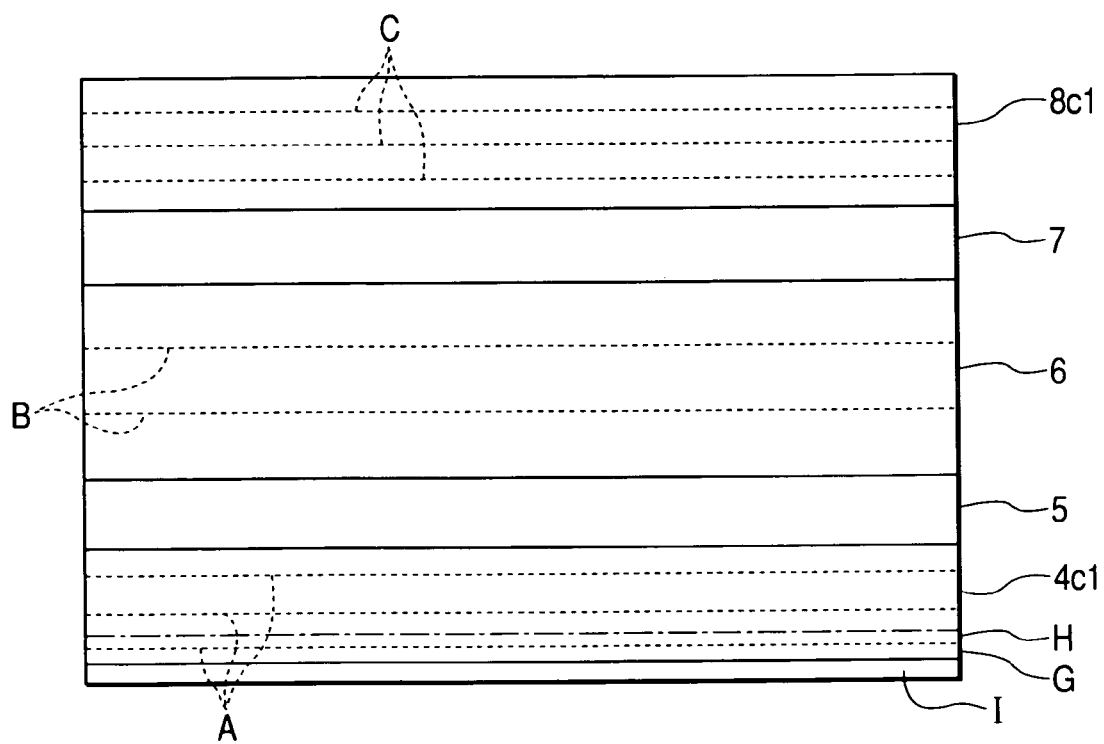
FIG. 3 is a partially enlarged view schematically a structure of laminated layers from a non-magnetic material layer-side magnetic layer of a lower fixed magnetic layer shown in FIG. 1 to an upper fixed magnetic layer N and a non-magnetic material layer-side fixed magnetic layer.

FIG. 3 is a partially enlarged view illustrating schematically a structure of laminated layers from the non-magnetic material layer-side magnetic layer 4c1 of the lower fixed magnetic layer 4 shown in FIG. 1 to a non-magnetic material layer-side magnetic layer 8c1 of the upper fixed magnetic layer 8.

In FIG. 3, dot-line regions A, B, and C are locations where the composition ratio of the element α is increasing in the respective magnetic layers 4c1, 8c1, and 6. As will be described in the following method of manufacturing the magnetic detecting device, each of the free magnetic layer 6 and the non-magnetic material layer-side magnetic layers 4c1 and 8c1 is formed with a laminated structure of the magnetic layer made of a material containing $Co_2MnGe$ and an intermediate layer made of a material containing Cu. It is considered that because of the heat treatment, $Co_2MnGe$ diffuses into the intermediate layer, and Cu diffuses into the magnetic layer made of a material containing $Co_2MnGe$. Even though each of the dot-line regions A, B, and C has an intermediate layer formed therein, Co, Mn, and Ge also disperse into the dot-line regions A, B, and C. However, in the dot-line regions A, B, and C, the composition ratio of Cu becomes larger than that of the other portion. If considering the composition ratio of the element α in each of upper and lower regions H and G with one dot-line region A of the non-magnetic material layer-side magnetic layer 4c1 interposed therebetween, the composition ratio of the element α gradually increases toward the dot-line region A from a bottom surface in the lower region G, and the composition ratio of the element α gradually decreases upward from the surface of the dot-line region A in the upper region H. The intermediate layer made of a material containing Cu has the extremely thin film thickness, as compared with the magnetic layer made of a material containing $CO_2MnGe$. As a result, in all portions of a region I ranging from a bottom surface of the non-magnetic material layer-side magnetic layer 4c1 to the region G, the element α may not be contained. For example, assuming that a region where the element α is not contained in the entire region toward the top surface from the bottom surface, a region where the composition ratio of the element α increases toward the top surface from the bottom surface, and a region where the composition ratio of the element α decreases toward the top surface from the bottom surface is one cycle, the cycle is repeated many times in the respective magnetic layers 4c1, 6, and 8c1. The regions A, B, and C having a high composition ratio of the element α do not exist on the top and bottom surfaces of each of at least the magnetic layers 4c1, 6, and 8c1. If the regions A, B, and C having a high composition ratio of the element α do exist on the top and bottom surfaces of each of the magnetic layers 4c1, 6, and 8c1, ΔRA may be decreased or the ferromagnetic coupling magnetic field $H_{in}$ may be increased.

The regions where the composition ration of Cu is larger that that of the other portion (dot-line regions A, B, and C) exist in the free magnetic layer 6 or the non-magnetic material layer-side magnetic layers 4c1 and 8c1, so that spin-dependent interface scattering of downspin may be increased in the regions where a bulk scattering coefficient β and the composition ratio of Cu increases and more preferably, ΔRA may be increased. However, according to the embodiment of the invention, even if the element α diffuses uniformly in the magnetic alloy without being densely concentrated into specific portions, the bulk scattering coefficient β and ΔRA can be increased.

As described above, the average composition ratio of the element α is within a range of 0 to 17.5 at. %. In this case, the 'average composition ratio' refers to the composition ratio of the element α, when assuming as 100 at. % a total sum of the respective composition ratios of the elements X, Y, Z, and α contained in the entire region of each of the free magnetic layer 6 and the non-magnetic material layer-side magnetic layers 4c1 and 8c1. At the plurality of locations, the composition ratio of each element is calculated so as to obtain its average.

Preferably, the average composition ratio of the element α is within a range of 5.0 to 15.0 at. %. As a result, ΔRA can be more properly increased.

In the meantime, in the CPP-type magnetic detecting device shown in FIG. 1, it is required that not only the increase of ΔRA but also a ferromagnetic coupling magnetic field $H_{in}$ generated by magnetostatic coupling between the free magnetic layer 6 and each of the second fixed magnetic layers 4c and 8c (topological coupling) are decreased. In order to decrease the ferromagnetic coupling magnetic field $H_{in}$, the ferromagnetic alloy layer whose composition formula is represented as $X_aY_bZ_c\alpha_d$ is preferably formed on the interface with each of the non-magnetic material layers 5 and 7. According to the structure illustrated in FIG. 1, each of the free magnetic layer 6 and the non-magnetic material layer-side magnetic layers 4c1 and 8c1 is formed of the non-magnetic alloy layer whose composition formula is represented as $X_aY_bZ_c\alpha_d$, and the magnetic alloy layer comes into contact with the interface with each of the non-magnetic material layers 5 and 7. Therefore, the ferromagnetic coupling magnetic field $H_{in}$ can be properly decreased.

Figure 2:
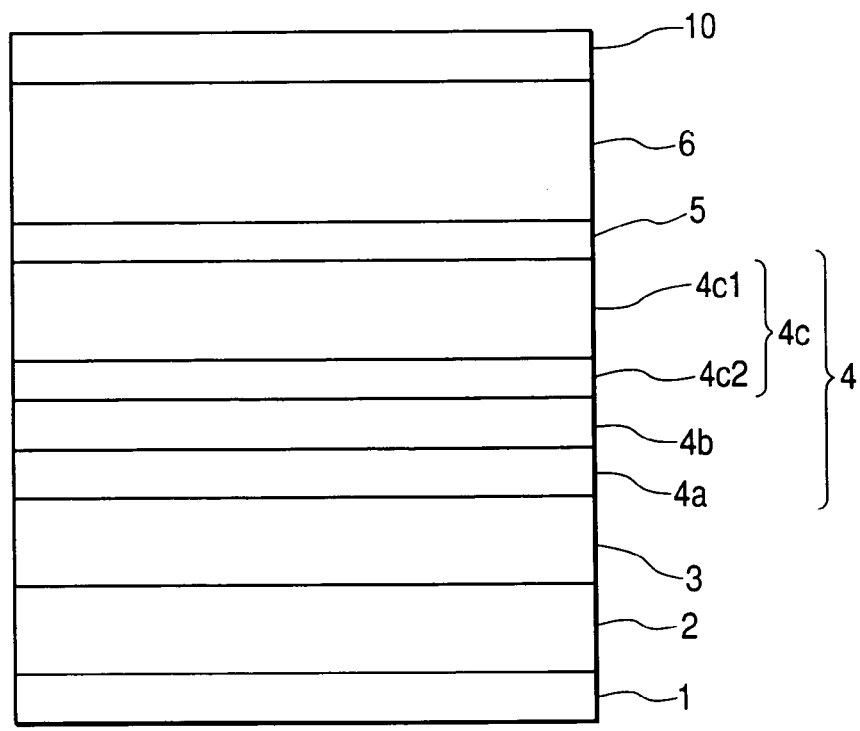
FIG. 2 is a diagram schematically illustrating a structure of a magnetic detecting device (single spin-valve thin film device) according to a second embodiment of the invention as viewed from a facing surface side of a recording medium.

FIG. 2 is a diagram schematically illustrating a film structure of a CPP-type single spin-valve thin film device. In FIG. 2, the same reference numerals as FIG. 1 denote the same layers as FIG. 1.

The CPP-type single spin-valve thin film device shown in FIG. 2 has a structure in which it has a base layer 1, a seed layer 2, an antiferromagnetic layer 3, a fixed magnetic layer 4, a non-magnetic material layer 5, a free magnetic layer 6, and a protective layer 10, which are sequentially laminated from the bottom. Also in the CPP-type single spin-valve thin film device shown in FIG. 2, each of the non-magnetic material layer-side magnetic layer 4c1, which forms the fixed magnetic layer 4, and the free magnetic layer 6 is formed of a magnetic alloy layer whose composition formula is represented as $X_aY_bZ_c\alpha_d$ and an average composition ratio d of the element α is within a range which is greater than 0 at. % and not more than 17.5 at. %. A specific kind or composition ratio of each of the elements X, Y, Z and α is the same as the above-mentioned description.

The above-mentioned magnetic alloy layer whose composition formula is represented as $X_aY_bZ_c\alpha_d$ is an alloy obtained by adding an element α to a Heusler alloy whose composition formula is represented as $X_2YZ$ or XYZ. Preferably, the magnetic alloy layer has a crystal structure of an $L_{21}$ type.

Since each of the non-magnetic material layer-side magnetic layer 4c1 and the free magnetic layer 6 is formed of the magnetic alloy layer whose composition formula is represented as $X_aY_bZ_c\alpha_d$, a bulk scattering coefficient or the like can be increased. As a result, ΔRA can be properly increased. Further, a ferromagnetic coupling magnetic field $H_{in}$ generated by magnetostatic coupling (topological coupling) between each of the fixed magnetic layers 4 and 8 and the free magnetic layer 6 can be decreased. Furthermore, as described in FIGS. 1 and 3, the composition of the element α contained in each of the non-magnetic material layer-side magnetic layer 4c1 and the free magnetic layer 6 may be changed. Moreover, the CPP-type single spin-valve thin film device may have a structure in which the free magnetic layer 6, the non-magnetic material layer 5, the fixed magnetic layer 4, and the antiferromagnetic layer 3 are sequentially laminated from the bottom.

Figure 4:
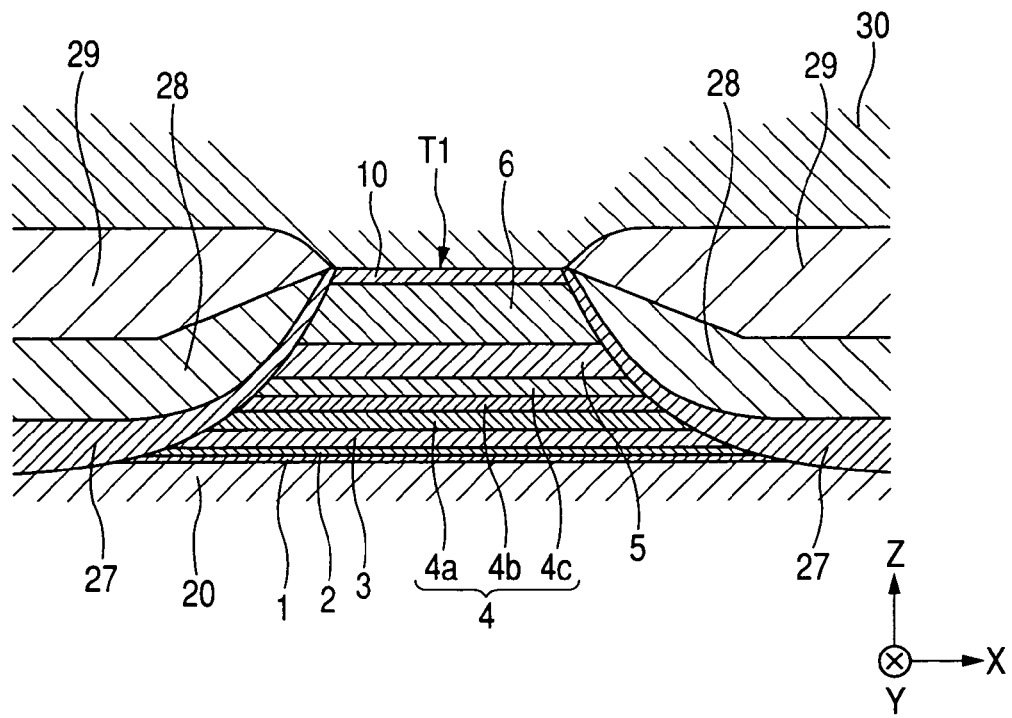
FIG. 4 is a partial cross-sectional view illustrating a reproducing head having the same structure as the magnetic detecting device shown in FIG. 2 as viewed from a facing surface side of a recording medium.

FIG. 4 is a partial cross-sectional view illustrating a reproducing head having the same structure as the CPP-type single spin-valve thin film device shown in FIG. 2 as viewed from a facing surface side of a recording medium.

Reference numeral 20 indicates a lower shield layer 20 made of a magnetic material, and a multilayered film T1 having the same structure as the film structure shown in FIG. 2 is formed on the lower shield layer 20.

The multilayered film T1 includes a base layer 1, a seed layer 2, an antiferromagnetic layer 3, a fixed magnetic layer 4, a non-magnetic material layer 5, a free magnetic layer 6, and a protective layer 10, which are sequentially laminated from the bottom. According to the embodiment illustrated in FIG. 4, insulating layers 27, hard bias layers 28, and insulating layers 29 are laminated at both sides of the multilayered film T1. The perpendicular bias magnetic field from the hard bias layers 28 orients the magnetization vector of the free magnetic layer 6 in the track width direction (the X direction in the drawing).

A bias base layer (not shown) may be formed between the insulating layer 27 and the hard bias layer 28. The bias base layer is made of, for example, Cr, W, a W—Ti alloy, a Fe—Cr Alloy or the like.

Each of the insulating layers 27 and 29 is formed of an insulating material, such as $Al_2O_3$, $SiO_2$, or the like, and insulates the hard bias layer 28 in a vertical direction in order to prevent that a current flowing through the multilayered film T1 in a direction perpendicular to the interface of each layer is divided at both sides of the multilayered film T1 in a track width direction.

Each of the hard bias layers 28 and 28 is formed of, for example, a cobalt-platinum (Co—Pt) alloy or a cobalt-chromium-platinum (Co—Cr—Pt) alloy.

An upper shield layer 30 made of a magnetic material is formed on the insulating layer 29 and the protective layer 10. In the CPP-type spin-valve thin film device, the lower shield layer 20 and the upper shield layer 30 serve as an electrode, and serves to a current source which flows a current in a direction perpendicular to the interfaces of the respective layers constituting the multilayered film T1.

The magnetization vector of the free magnetic layer 6 is oriented in a direction parallel to the track width direction (X direction in the drawing) by means of a perpendicular bias magnetic field from the hard bias layers 28 and 28. In addition, the magnetization vector of the free magnetic layer 6 varies with superior sensitivity with respect to a signal magnetic field (external magnetic field) from the recording medium. In contrast, the magnetization vector of the fixed magnetic layer 4 is fixed in a direction parallel to a heightwise direction (Y direction in the drawing).

An electric resistance varies according to a relationship between the varied magnetization direction of the free magnetic layer 6 and the fixed magnetization direction of the fixed magnetic layer 4 (in particular, a fixed magnetization direction of a second magnetic layer 4c), and a leakage magnetic field is detected from the recording medium due to a voltage variation or current variation based on the variation of the electric resistance.

Figure 5:
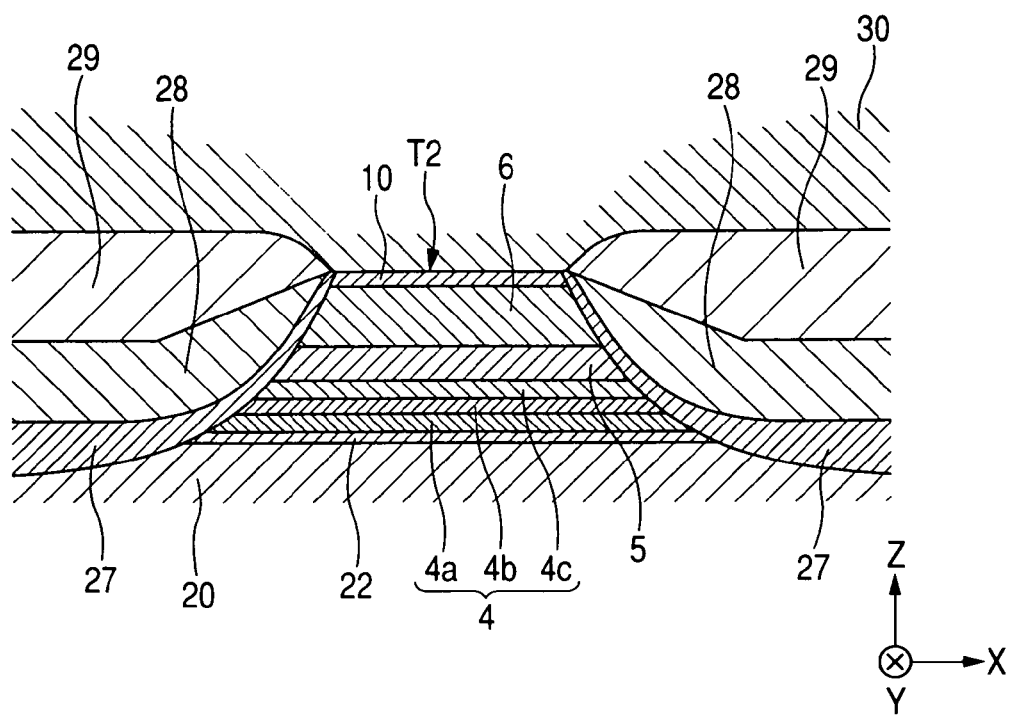
FIG. 5 is a partial cross-sectional view illustrating a reproducing head having the same structure as a magnetic detecting device having a layer structure different from that in FIG. 4 as viewed from a facing surface side of a recording medium.

FIG. 5 is a partial cross-sectional view illustrating a reproducing head having the same structure as the CPP-type single spin-valve thin film device having a structure different from that in FIG. 4 as viewed from a facing surface side of a recording medium.

In FIG. 5, the antiferromagnetic layer 2 shown in FIG. 4 is not provided. FIG. 5 shows a so-called self-fixing magnetic detecting device in which the magnetization vector of the fixed magnetic layer 4 is fixed by uniaxial anisotropy of the fixed magnetic layer itself.

In FIG. 5, below the fixed magnetic layer 4, a magnetostriction enhancing layer 22 is formed with a thickness of 5 Å to 50 Å. The magnetostriction enhancing layer 22 is formed of, for example, a single element, such as Pt, Au, Pd, Ag, Ir, Rh, Ru, Re, Mo, W, or the like, an alloy of at least two elements selected from the group consisting of these element, or an R—Mn alloy (in this case, the element R is at least one element selected from a group consisting of Pt, Rd, Ir, Rh, Ru, Os, Ni, and Fe).

A magnetic elastic energy is increased by increasing a magnetostriction constant λs of the fixed magnetic layer 4, so that the uniaxial anisotropy of the fixed magnetic layer 4 becomes larger. If the uniaxial anisotropy of the fixed magnetic layer 4 becomes larger, the magnetization vector of the fixed magnetic layer 4 is firmly fixed in a predetermined direction. Further, the output of the magnetic detecting device is increased and the output stability or symmetry is improved.

In the magnetic detecting device shown in FIG. 5, on a surface of the first fixed magnetic layer 4a constituting the fixed magnetic layer 4 opposite to the non-magnetic material layer 5, the non-magnetic metallic magnetorestriction enhancing layer 22 is provided in a state in which it comes into contact with the first fixed magnetic layer 4a. As a result, distortion occurs in a crystal structure of the bottom surface of the first fixed magnetic layer 4a so as to increase the magnetorestriction constant λs of the first fixed magnetic layer 4a. Therefore, the uniaxial anisotropy of the fixed magnetic layer 4 becomes larger, and even though the antiferromagnetic layer 3 is not provided, the fixed magnetic layer 4 can be firmly fixed in a direction parallel to a heightwise direction (Y direction in the drawing).

Although the single spin-valve thin film device has been mainly described with reference to FIGS. 4 and 5, the dual spin-valve thin film device shown in FIG. 1 is formed with the same layer structure.

Each of FIGS. 6 to 9 is a diagram illustrating one process of a method of manufacturing the dual spin-valve thin film device shown in FIG. 1 in order to form a film structure, which schematically illustrates the partial film structure of the dual spin-valve thin film device during the manufacturing process.

Figure 6:
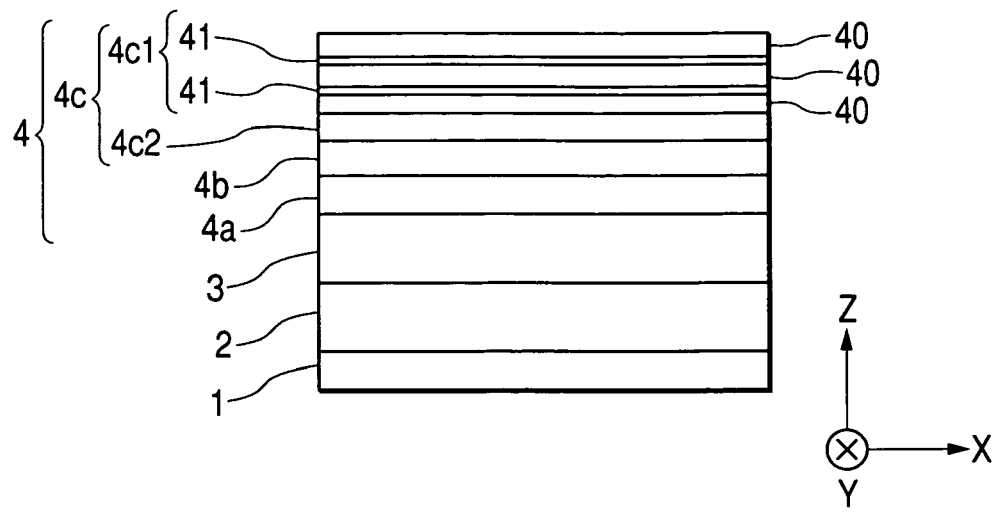
FIG. 6 is a diagram (schematic diagram) illustrating one process of a method of manufacturing the dual spin-valve thin film device shown in FIG. 1.

In one process illustrated in FIG. 6, the base layer 1, the seed layer 2, the antiferromagnetic layer 3, and the first fixed magnetic layer 4a, the non-magnetic intermediate layer 4b and the non-magnetic intermediate layer-side magnetic layer 4c2, which forms the fixed magnetic layer 4, are formed by means of a sputtering method or a deposition method. Since the materials of the respective layers have been described in FIG. 1, the description thereof will be omitted.

Next, as shown in FIG. 6, the non-magnetic material layer-side magnetic layer 4c1 is formed on the non-magnetic intermediate layer-side magnetic layer 4c2 by means of a sputtering method or a deposition method. As shown in FIG. 6, the magnetic layer 40 whose composition formula is represented as $X_2YZ$ or XYZ is formed on the non-magnetic intermediate layer-side magnetic layer 4c1 by means of a sputtering method or deposition method. Then, the intermediate layer 41 made of a material containing the element α is formed on the magnetic layer 40 by means of a sputtering method or deposition method. The lamination process of the magnetic layer 40 and the intermediate layer 41 is repeated so as to form the non-magnetic material layer-side magnetic layer 4c1.

Further, the element X is at least one element selected from a group consisting of Co, Ni, Rh, Pt, Au, Pd, Ir, Ru, Ag, Zn, Cd and Fe, the element Y is at least one element selected from a group consisting of Mn, Fe, Ti, V, Zr, Nb, Hf, Ta, Cr, Co, and Ni, the element Z is at least one element selected from a group consisting of Al, Sn, In, Sb, Ga, Si, Ge, Pb, and Zn, and the element α is Cu and/or Ni. For example, the magnetic layer 40 is formed of a material containing $CO_2MnGe$, the intermediate layer 41 is formed of a material containing Cu, and the non-magnetic material layer-side magnetic layer 4c1 is formed with a laminated structure made of $Co_2MnGe$/Cu. At this time, the magnetic layer 40 is formed on the top surface of the non-magnetic material layer-side magnetic layer 4c1.

Preferably, the intermediate layer 41 is formed with a thickness of 1 Å to 6 Å, and the intermediate layer 40 is formed with a thickness of 10 Å to 20 Å. Further, the magnetic layer 40 is preferably formed with a multilayered structure of two layers to four layers.

Figure 7:
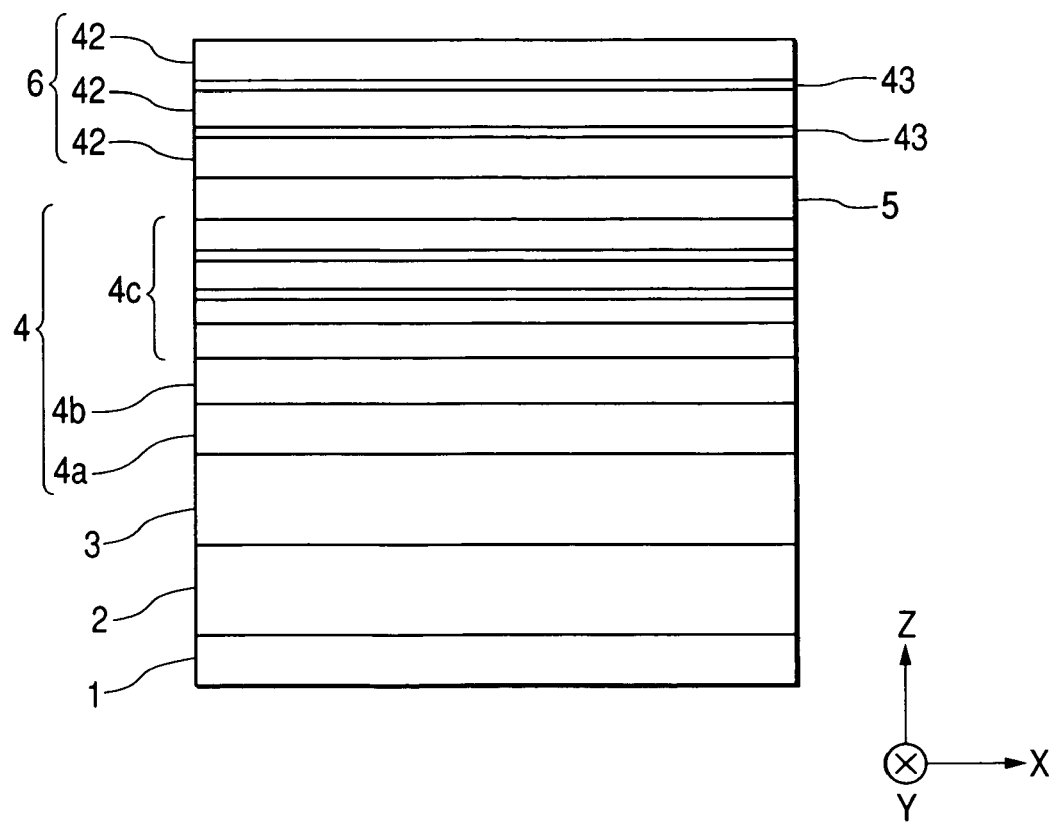
FIG. 7 is a diagram (schematic diagram) illustrating one process executed after the process of FIG. 6.

Next, in a process illustrated in FIG. 7, by a sputtering method or deposition method, the non-magnetic material layer 5 is formed on the non-magnetic material layer-side magnetic layer 4c1, and the free magnetic layer 6 is formed on the non-magnetic material layer 5. As shown in FIG. 7, the magnetic layer 42 whose composition formula is represented as $X_2YZ$ or XYZ is formed on the non-magnetic material layer 5 by means of a sputtering method or deposition method. Then, an intermediate layer 43 containing an element α is formed on the magnetic layer 42 by means of a sputtering method or deposition method. The lamination process of the magnetic layer 42 and the intermediate layer 43 is repeated so as to form the free magnetic layer 6. For example, the magnetic layer 42 is formed of a material containing $Co_2MnGe$, the intermediate layer 43 is formed of a material containing Cu, and the free magnetic layer 6 is formed with a laminated structure made of $Co_2MnGe$/Cu. At this time, the magnetic layer 42 is formed on the top surface of the free magnetic layer 6.

Preferably, the intermediate layer 43 is formed with a thickness of 1 Å to 6 Å, and the magnetic layer 42 is formed with a thickness of 10 Å to 35 Å. Further, the magnetic layer 42 is preferably formed with a multilayered structure of three to eight layers.

Figure 8:
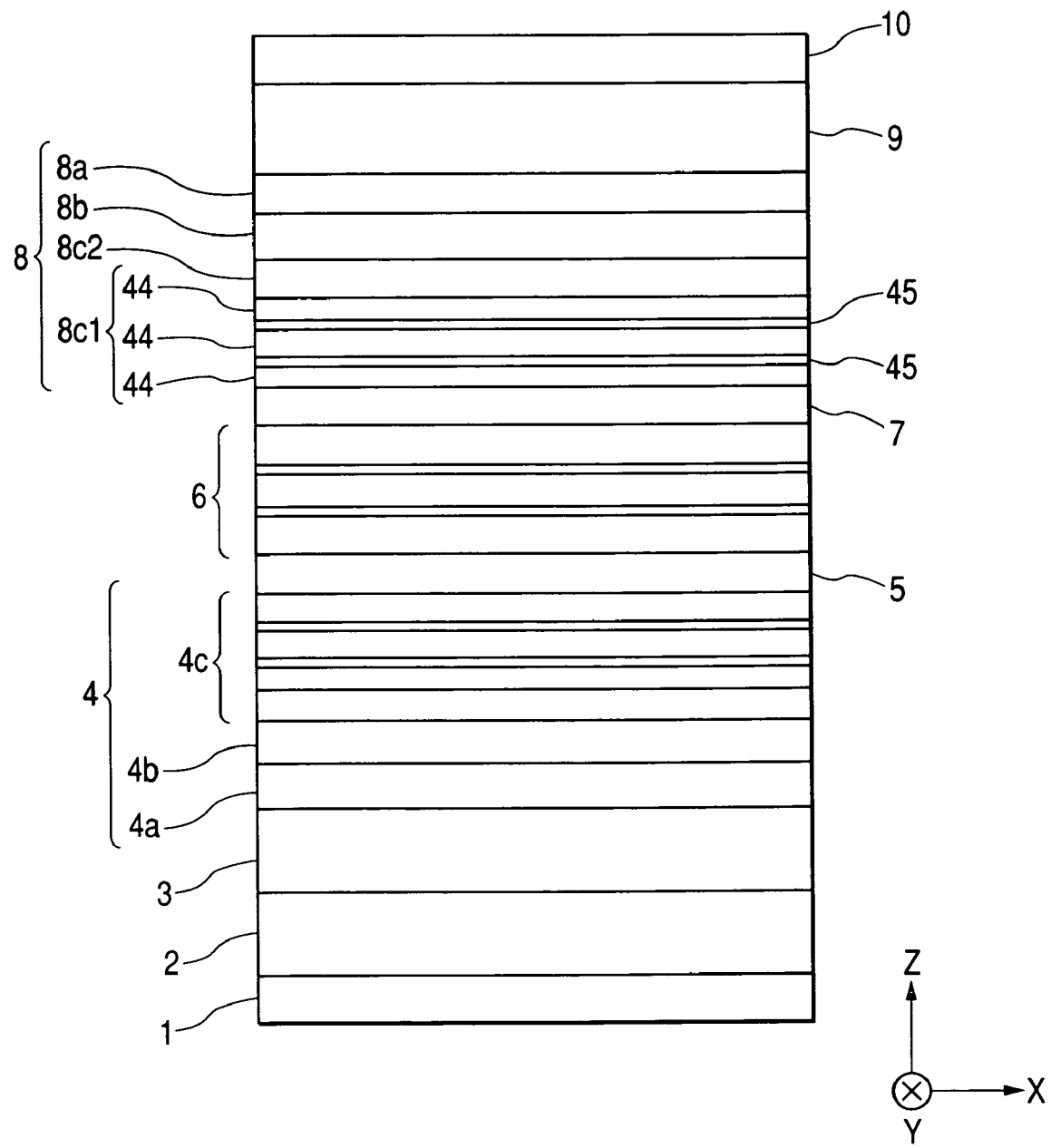
FIG. 8 is a diagram (schematic diagram) illustrating one process executed after the process of FIG. 7.

Next, in a process illustrated in FIG. 8, by a sputtering method or deposition method, the non-magnetic material layer 7 is formed on the free magnetic layer 6, and the non-magnetic material layer-side magnetic layer 8c1 constituting the second fixed magnetic layer 8c of the upper fixed magnetic layer 8 is formed on the non-magnetic material layer 7. As shown in FIG. 8, the magnetic layer 44 whose composition formula is represented as $X_2YZ$ or XYZ is formed on the non-magnetic material layer 7 by means of a sputtering method or deposition method. Then, an intermediate layer 45 containing an element α is formed on the magnetic layer 44 by means of a sputtering method or deposition method. The lamination process of the magnetic layer 44 and the intermediate layer 45 is repeated so as to form the non-magnetic material layer-side magnetic layer 8c1. For example, the magnetic layer 44 is formed of a material containing $Co_2MnGe$, the intermediate layer 45 is formed of a material containing Cu, and the non-magnetic material layer-side magnetic layer 8c1 is formed with a laminated structure made of $Co_2MnGe$/Cu. At this time, the magnetic layer 44 is formed on the top surface of the non-magnetic material layer-side magnetic layer 8c1. Preferably, the intermediate layer 45 is formed with a thickness of 1 Å to 6 Å, and the magnetic layer 44 is formed with a thickness of 10 Å to 20 Å. Further, the magnetic layer 44 is preferably formed with a multilayered structure of two to fourth layers.

Further, as shown in FIG. 8, by means of a sputtering method or deposition method, the non-magnetic intermediate layer-side magnetic layer 8c2 is formed on the non-magnetic material layer-side magnetic layer 8c1, the non-magnetic intermediate layer Bb is formed on the non-magnetic intermediate layer-side magnetic layer 8c2, and the first fixed magnetic layer 8a is formed on the non-magnetic intermediate layer 8b. Then, by means of a sputtering method or deposition method, the antiferromagnetic layer 9 is formed on the first fixed magnetic layer 8a, and the protective layer 10 is formed on the antiferromagnetic layer 9.

After all the layers from the base layer 1 to the protective layer 10 are laminated, the heat treatment is performed. As a result, an exchange coupling magnetic field is generated at interfaces between the antiferromagnetic layers 2 and 9 and the first fixed magnetic layers 4a and 8a constituting the fixed magnetic layers 4 and 8, respectively, and thus the first fixed magnetic layers 4a and 8a are magnetized in a direction parallel to a heightwise direction (Y direction in the drawing). In addition, the RKKY interaction is generated between the first fixed magnetic layers 4a and 8a and the second fixed magnetic layers 4c and 8c, and the second fixed magnetic layers 4c and 8c are magnetized in directions antiparallel to the magnetization directions of the first fixed magnetic layers 4a and 8a.

Figure 9:
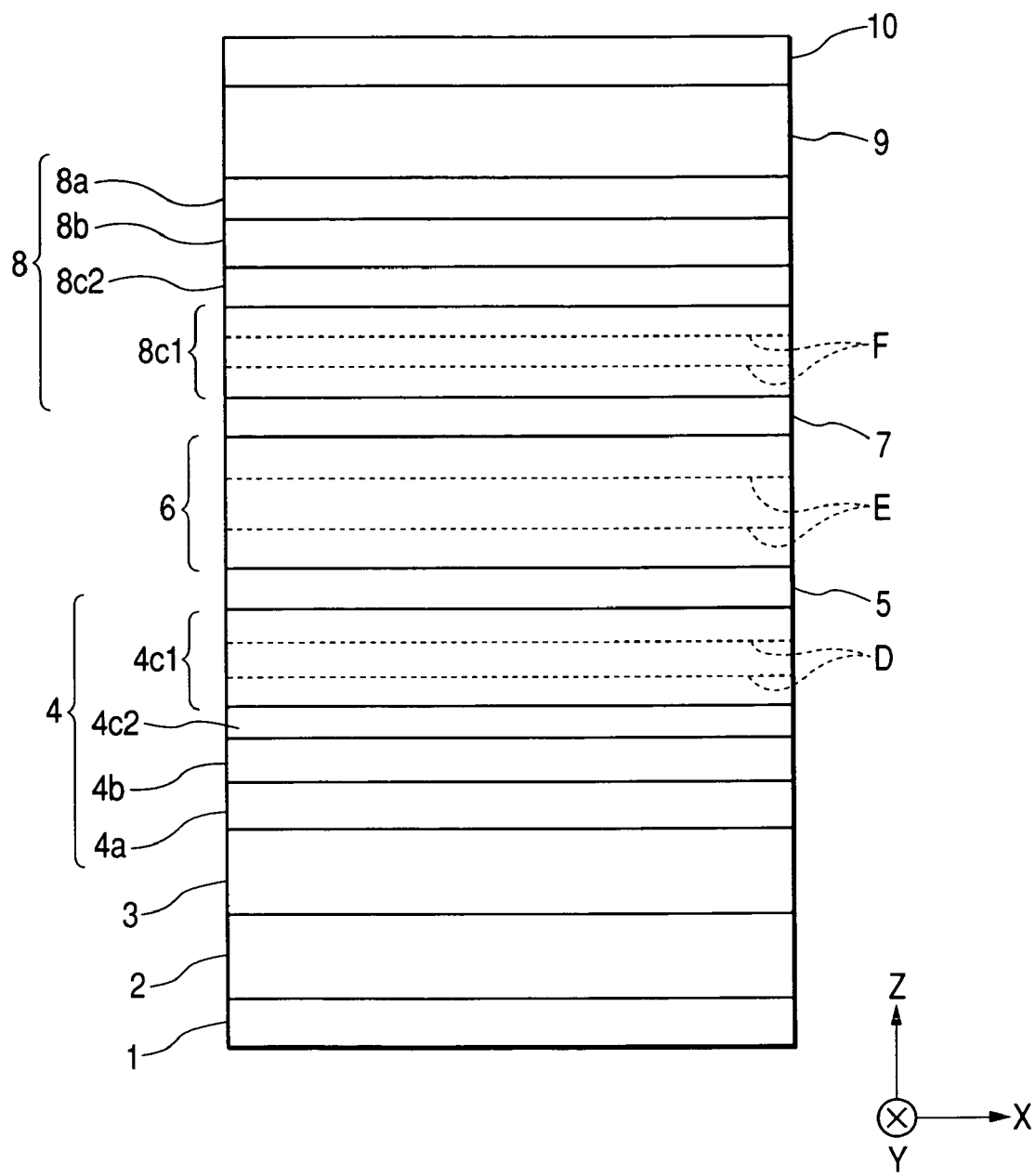
FIG. 9 is a diagram (schematic diagram) illustrating one process executed after the process of FIG. 8.

By means of the heat treatment, in the non-magnetic material layer-side magnetic layers 4c1 and 8c1 and the free magnetic layer 6, each of the intermediate layers 41, 43 and 45, and the magnetic layers 40, 42 and 44 causes the diffusion. In FIG. 9, dot-line locations D, E, and F are regions where the intermediate layers 41, 43, and 45 are formed in each of the non-magnetic material layer-side magnetic layers 4c1 and 8c1 and the free magnetic layer 6 before performing the heat treatment. At each of the dot-line locations D, E, and F, even though a diffusion phenomenon is generated by the heat treatment, the composition ratio of the element α is larger than those of the other portions. For this reason, in each of the non-magnetic material layer-side magnetic layers 4c1 and 8c1 and the free magnetic layer 6, the composition ratio of the element α repeatedly increases or decreases in a film thickness direction (Z direction in the drawing), so that the composition variation is generated. Each of the intermediate layers 41, 43, and 45 is formed of an extremely thin film, as compared with the magnetic layers 40, 42, and 44. As a result, the element α may not be diffused over the entire regions of the non-magnetic material layer-side magnetic layers 4c1 and 8c1 and the free magnetic layer 6, and in all of the non-magnetic material layer-side magnetic layers 4c1 and 8c1 and the free magnetic layer 6, the element α may not be contained. Alternatively, the element α may be diffused over the entire regions of the non-magnetic material layer-side magnetic layers 4c1 and 8c1 and the free magnetic layer 6. However, even in any one of both cases, it is considered that in the above-mentioned method of manufacturing the magnetic detecting device, the composition ratio of the element α varies in a film thickness direction.

Each of the intermediate layers 41, 43, and 45 is formed within a range of the film thickness, and each of the magnetic layers 40, 42, and 44 is formed in accordance with the above-mentioned film thickness and the number of layers. As a result, in each of the non-magnetic material layer-side magnetic layers 4c1 and 8c1 and the free magnetic layer 6, the average composition ratio of the element α can be properly adjusted within a range which is greater than 0 at. % and not more than 17.5 at. %.

In the method of manufacturing the CPP-type spin-valve thin film device shown in FIGS. 6 to 9, the magnetic layer 5 whose composition formula is represented as $X_2YZ$ or XYZ and the intermediate layer containing the element α are alternately laminated so as to form each of the non-magnetic material layer-side magnetic layers 4c1 and 8c1 and the free magnetic layer 6. Therefore, the CPP-type spin-valve thin film device capable of increasing ΔRA can be formed by using a simple manufacturing method without changing existing manufacturing facilities. In particular, it is considered that the magnetic layer whose composition formula is represented as $X_2YZ$ or XYZ and the intermediate layer containing the element α are alternately laminated. Therefore, in the non-magnetic material layer-side magnetic layers 4c1 and 8c1 and the free magnetic layer 6, the composition ratio of the element α varies in the film thickness direction, and spin-dependent interface scattering of downspin may be increased in the regions where the composition ratio of the element α is large, so that ΔRA may be increased.

In addition, each of the non-magnetic material layer-side magnetic layers 4c1 and 8c1 and the free magnetic layer 6 may be formed with a single layer by means of a target containing the elements X, Y, Z and α. At this time, it is considered that in the non-magnetic material layer-side magnetic layers 4c1 and 8c1 and the free magnetic layer 6, the element α is contained without being densely concentrated into specific portions in a thickness direction (in particular, without causing the variation of the composition).

In the above-mentioned embodiment, both the non-magnetic material layer-side magnetic layers 4c1 and 8c1 and the free magnetic layer 6 are formed of the magnetic alloy layers each of which a composition ratio is represented as $X_aY_bZ_c\alpha_d$, but only either the non-magnetic material layer-side magnetic layers 4c1 and 8c1 or the free magnetic layer 6 may be formed of the magnetic alloy layer having a composition formula represented as $X_aY_bZ_c\alpha_d$.

Embodiment

The dual spin-valve thin film device shown in FIG. 1 was manufactured.

A structure of a base substrate was as follows: a base layer 1; Ta(30)/a seed layer 2; NiFeCr (50)/a lower antiferromagnetic layer 3; IrMn (70)/a lower fixed magnetic layer 4 [a first magnetic layer 4a; $Fe_{30\ at.\ \%}Co_{70\ at.\ \%}$ (30)/a non-magnetic intermediate layer 4b; Ru (9.1)/a second fixed magnetic layer 4c]/a non-magnetic material layer 5; Cu (43)/a free magnetic layer 6/a non-magnetic material layer 7; Cu (43)/an upper fixed magnetic layer 8 [a second magnetic layer 8c/a non-magnetic intermediate layer 8b; Ru (9.1)/a first fixed magnetic layer 8a; $Fe_{40\ at.\ \%}Co_{60\ at.\ \%}$ (30)]/an upper antiferromagnetic layer 9; IrMn (70)/a protective layer 10; Ta (200).

The second fixed magnetic layer 4c is formed with a laminated structure of $Fe_{40\ at.\ \%}Co_{60\ at.\ \%}$ (10)/$Co_2MnGe$ (40), and the second fixed magnetic layer 8c is formed with a laminated structure of $Co_2MnGe$ (40)/$Fe_{40\ at.\ \%}Co_{60\ at.\ \%}$ (10). In this case, in parentheses, a numerical value indicates a film thickness and a unit thereof is angstrom.

In experiments, similar to FIG. 7, samples (samples 1 to 9) obtained by forming the free magnetic layer 6 with a laminated structure of the magnetic layer 40 and the intermediate layer 41 and samples (samples 10 to 12) obtained by laminating the plurality of magnetic layers 40 were prepared. As for the samples 1 to 9, the thickness or number of the magnetic layers 40 and a material or thickness of the intermediate layer 41 were diversely changed. The free magnetic layer 6 in each of the samples was formed, as shown in the following Table 1. In addition, the structure of the free magnetic layer 6 shown in the following Table 1 is a layer structure at a step where the free magnetic layer was formed (before performing a heat treatment). After the free magnetic layer is formed, the heat treatment is performed.

TABLE 1

| Sample | Structure of free magnetic layer | Intermediate layer | The number of $Co_2MnGe$ layers |
|---|---|---|---|
| 1 | {$Co_2MnGe$(33)/Cu(1.0)} × 2/$Co_2MnGe$(34) | Cu(1.0) | 3 |
| 2 | {$Co_2MnGe$(14)/Cu(1.0)}/{$Co_2MnGe$(12)/Cu(1.0)} × 6/$Co_2MnGe$(14) | Cu(1.0) | 8 |
| 3 | {$Co_2MnGe$(33)/Cu(2.0)} × 2/$Co_2MnGe$(34) | Cu(2.0) | 3 |
| 4 | {$Co_2MnGe$(20)/Cu(2.0)} × 4/$Co_2MnGe$(20) | Cu(2.0) | 5 |
| 5 | {$Co_2MnGe$(14)/Cu(2.0)}/{$Co_2MnGe$(12)/Cu(2.0)} × 6/$Co_2MnGe$(14) | Cu(2.0) | 8 |
| 6 | {$Co_2MnGe$(33)/Fe(2.0)} × 2/$Co_2MnGe$(34) | Fe(2.0) | 3 |
| 7 | {$Co_2MnGe$(14)/Fe(2.0)}/{$Co_2MnGe$(12)/Fe(2.0)} × 6/$Co_2MnGe$(14) | Fe(2.0) | 8 |
| 8 | {$Co_2MnGe$(33)/Ni(2.0)} × 2/$Co_2MnGe$(34) | Ni(2.0) | 3 |
| 9 | {$Co_2MnGe$(14)/Ni(2.0)}/{$Co_2MnGe$(12)/Ni(2.0)} × 6/$Co_2MnGe$(14) | Ni(2.0) | 8 |
| 10 | {$Co_2MnGe$(5)} × 20 | None | 20 |
| 11 | {$Co_2MnGe$(10)} × 10 | None | 10 |
| 12 | $Co_2MnGe$(100) | None | 1 |

The respective samples were classified into groups by using Cu (1.0), Cu (2.0), Fe (2.0), Ni (2.0), and none, which were used in the intermediate layer 41. Then, in each of the groups, a relationship between the number of $Co_2MnGe$ layers in a free magnetic layer and ΔRA was calculated. The obtained experimental result is shown in FIG. 10.

Figure 10:
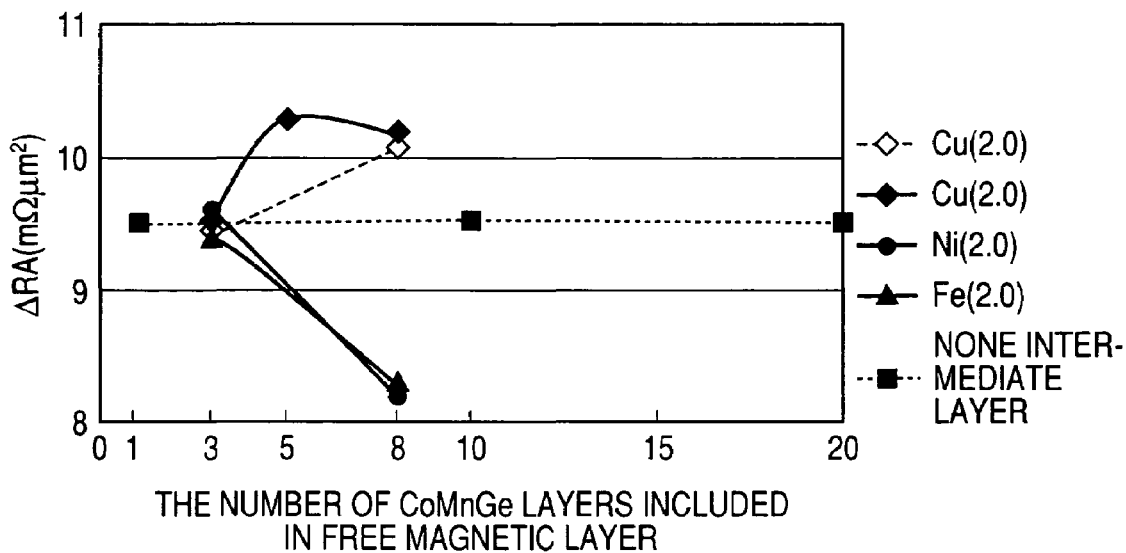
FIG. 10 is a graph illustrating a relationship between the number of magnetic layers (CoMnGe) within a free magnetic layer and ΔRA in a case in which any one of Cu (1.0), Cu (2.0), Fe (2.0), and Ni (2.0) is used as a forming material of an intermediate layer and a relationship between the number of magnetic layers (CoMnGe) within a free magnetic layer and ΔRA in a case in which the intermediate layer is not formed.

As shown in FIG. 10, it could be apprehended that in each of the samples 10, 11 and 12 in which the intermediate layer 41 was not provided and the number of $Co_2MnGe$ layers is plural, even if the number of $Co_2MnGe$ layers varies, ΔRA does not almost vary.

In contrast, in the samples 6 and 7 in which the intermediate layer 41 made of a material of Fe (2.0) is provided, ΔRA was more decreased than in the samples 10, 11, and 12 in which the intermediate layer 41 is not provided.

Further, in the samples 8 and 9 in which the intermediate layer 41 made of a material of Ni (2.0) is provided, ΔRA was more increased than in the samples 10, 11, and 12 in which the intermediate layer 41 is not provided.

Furthermore, in the samples 1 to 5 in which the intermediate layer 41 made of materials of Cu (1.0) and Cu (2.0) is provided, ΔRA was more increased than in the samples 10, 11, and 12 in which the intermediate layer 41 is not provided.

It could be apprehended from the experimental result shown in FIG. 10 that the intermediate layer 41 made of a material of Cu or Ni is preferably provided, and the intermediate layer 41 made of a material of Cu more preferably is provided.

Next, by using the above-mentioned base substrate structure, a plurality of samples having various structures of free magnetic layers 6 were formed, as shown in the following Table 2.

6 Å. In addition, at this time, it could be apprehended from Tables 1 and 2 that the magnetic layer 40 is preferably formed with a thickness of 10 Å to 35 Å and the number of the magnetic layers 40 is preferably about 3 to 8.

TABLE 2

| Structure of free magnetic layer | Total thickness of Co2MnGe Layer (Å) | Total thickness of Cu layer (Å) | Co (at. %) | Mn (at. %) | Ge (at. %) | Cu (at. %) | Total (at. %) |
| --- | --- | --- | --- | --- | --- | --- | --- |
| {Co$_2$MnGe(20)Cu(1)} × 3/Co$_2$MnGe(20) | 80 | 3 | 48.0 | 24.0 | 24.0 | 4.1 | 100.0 |
| {Co$_2$MnGe(20)Cu(2)} × 3/Co$_2$MnGe(20) | 80 | 6 | 46.1 | 23.0 | 23.0 | 7.8 | 100.0 |
| {Co$_2$MnGe(20)Cu(3)} × 3/Co$_2$MnGe(20) | 80 | 9 | 44.4 | 22.2 | 22.2 | 11.3 | 100.0 |
| {Co$_2$MnGe(20)Cu(4)} × 3/Co$_2$MnGe(20) | 80 | 12 | 42.7 | 21.4 | 21.4 | 14.5 | 100.0 |
| {Co$_2$MnGe(20)Cu(5)} × 3/Co$_2$MnGe(20) | 80 | 15 | 41.3 | 20.6 | 20.6 | 17.5 | 100.0 |
| {Co$_2$MnGe(20)/Cu(6)} × 3/Co$_2$MnGe(20) | 80 | 18 | 39.9 | 19.9 | 19.9 | 20.3 | 100.0 |

Figure 11:
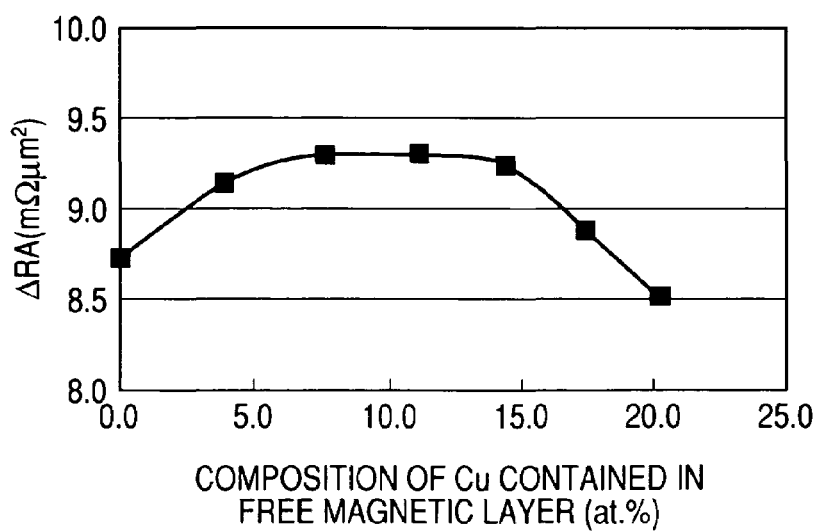
FIG. 11 is a graph illustrating a relationship between a composition ratio of Cu contained in the free magnetic layer and ΔRA.

After the heat treatment is performed for each sample, an average composition ratio of Cu occupied in the free magnetic layer 6 of each sample was calculated and a relationship between the average composition ratio of Cu and ΔRA was calculated. The obtained experimental result is shown in FIG. 11.

Next, by using the above-mentioned base substrate structure, a plurality of samples having various structures for each of the free magnetic layer 6 and the second fixed magnetic layers 4c and 8c were formed, as shown in the following Table 3.

TABLE 3

| Sample | Second fixed magnetic layer (Å)<br>The left side corresponds to the Ru side | Free magnetic layer<br>(The thickness is fixed so as to satisfy the condition Co$_2$MnGe – Total = 80 Å) (Å)<br>The left side corresponds to the bottom side |
| --- | --- | --- |
| 13 | 40FeCo(10)/Co$_2$MnGe(20)/Cu(2)/Cu(2)/Co$_2$MnGe(20)<br>Co$_2$MnGe – Total = 40 Å | {Co$_2$MnGe(20)/Cu(2)} × 3/Co$_2$MnGe(20) |
| 14 | 40FeCo(10)/{Co$_2$MnGe(14)/Cu(2)} × 2/Co$_2$MnGe(12)<br>Co$_2$MnGe – Total = 40 Å | ↑ |
| 15 | 40FeCo(10)/{Co$_2$MnGe(10)/Cu(2)} × 3/Co$_2$MnGe(10)<br>Co$_2$MnGe – Total = 40 Å | ↑ |
| 16 | 40FeCo(10)/{Co$_2$MnGe(8)/Cu(2)} × 4/Co$_2$MnGe(8)<br>Co$_2$MnGe – Total = 40 Å | ↑ |
| 17 | 40FeCo(10)/Co$_2$MnGe(40) | Co$_2$MnGe(80) |

As shown in FIG. 11, it could be apprehended that as compared with a case in which the free magnetic layer 6 is formed of only a material containing Co$_2$MnGe and Cu is not contained in the free magnetic layer 6 (in a case in which a composition ratio of Cu is 0 at. %), Cu whose composition ratio is within a range which is larger than 0 at. % and not more than 17.5 at. % is contained in the free magnetic layer 6, and thus ΔRA can be increased. In addition, it could be apprehended that if the average composition ratio of Cu is set within a range of 5.0 to 15.0 at. %, ΔRA can be increased, as compared with a case in which the free magnetic layer 6 is formed of only a material containing Co$_2$MnGe and Cu is not contained in the free magnetic layer 6.

In addition, it could be apprehended that when the free magnetic layer 6 is formed with a laminated structure of the magnetic layer 40 and the intermediate layer 41, the intermediate layer 41 is preferably formed with a thickness of 1 Å to As shown in Table 3, in all of the samples 13 to 16, the structure of the free magnetic layer 6 is the same. In the meantime, in the samples 13 to 16, when the second fixed magnetic layers 4c and 8c are formed, the thickness and the number of the individual magnetic layers was changed such that a total thickness of the magnetic layers made of Co$_2$MnGe becomes 40 Å. In the sample 17, each of the free magnetic layer 6 and the second fixed magnetic layers 4c and 8c was not formed with a laminated structure of Co$_2$MnGe and Cu. After the base substrate structure is formed, the heat treatment was performed.

Figure 12:
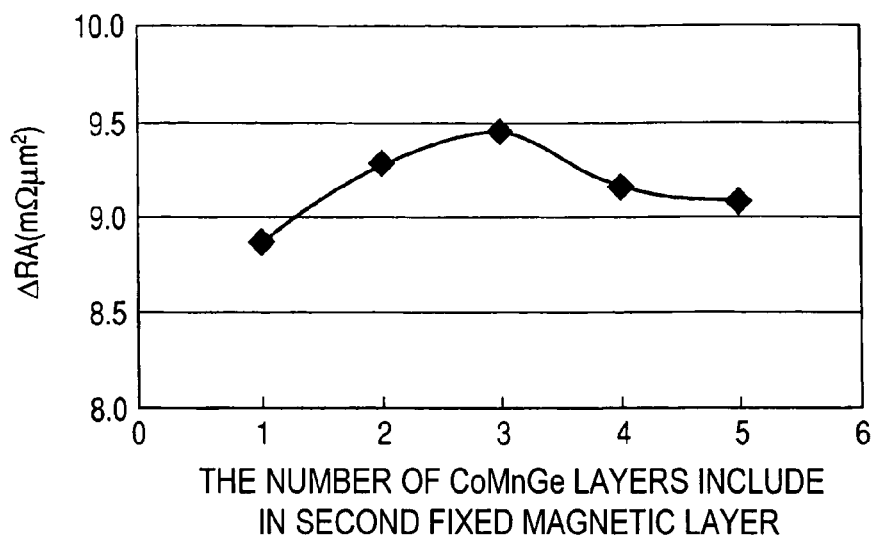
FIG. 12 is a graph illustrating a relationship between ΔRA and the number of magnetic layers (CoMnGe layers) included in a second fixed magnetic layer which is formed of a laminated structure of the magnetic layers and an intermediate layer (Cu)

As shown in FIG. 12, it could be apprehended that if the number of Co$_2$MnGe layers is set within a range of 2 to 5 in each of the second fixed magnetic layers 4c and 8c, ΔRA can be increased, as compared with a case in which only a Co$_2$MnGe is not provided in each of the second fixed magnetic layers 4c and 8c. In addition, it could be apprehended that if the number of Co$_2$MnGe layers is set within a range of 2 to 4 in each of the second fixed magnetic layers 4c and 8c, ΔRA can be surely increased, as compared with a case in which only a Co₂MnGe layer is not provided in each of the second fixed magnetic layers 4c and 8c.

Next, by using the above-mentioned base substrate structure, a plurality of samples having various structures for each of the free magnetic layer 6 and the second fixed magnetic layers 4c and 8c were formed, as shown in the following Table 4.

to 23 are classified into a group A, in each of the samples 19 to 23 of the group A, a relationship between the number of CoMnGe layers included in each of the second fixed magnetic layers 4c and 8c and ΔRA, and a relationship between the number of CoMnGe layers included in each of the second fixed magnetic layers 4c and 8c and the ferromagnetic coupling magnetic field $H_{in}$ were investigated. In addition, ΔRA and the ferromagnetic coupling magnetic field $H_{in}$ in the sample 18 are also graphed.

TABLE 4

| Sample | Thickness of second fixed magnetic layer (Å) | The number of CoMnGe layers in second fixed magnetic layer | Thickness of nonmagnetic material layer (Å) | Thickness of free magnetic layer (Å) |
|---|---|---|---|---|
| 18 | 40FeCo(10)/CoMnGe(40) (CoMnGe – Total = 40 Å) | 1 | 43 | CoMeGe(80) |
| 19 | ↑ (CoMnGe – Total = 40 Å) | 1 | ↑ | {CoMnGe(20)/Cu(2)} × 3/CoMnGe(20) |
| 20 | 40FeCo(10)/CoMnGe(20)/Cu(2)/CoMnGe(20) (CoMnGe – Total = 40 Å) | 2 | ↑ | ↑ |
| 21 | 40FeCo(10)/{CoMnGe(14)/Cu(2)} × 2/CoMnGe(12) (CoMnGe – Total = 40 Å) | 3 | ↑ | ↑ |
| 22 | 40FeCo(10)/{CoMnGe(10)/Cu(2)} × 3/CoMnGe(10) (CoMnGe – Total = 40 Å) | 4 | ↑ | ↑ |
| 23 | 40FeCo(10)/{CoMnGe(8)/Cu(2)} × 4/CoMnGe(18) (CoMnGe – Total = 40 Å) | 5 | ↑ | ↑ |
| 24 | 40FeCo(10)/CoMnGe(40) (CoMnGe – Total = 40 Å) | 1 | 50 | CoMnGe(80) |
| 25 | ↑ (CoMnGe – Total = 40 Å) | 1 | ↑ | {CoMnGe(20)/Cu(2)} × 3/CoMnGe(20) |
| 26 | 40FeCo(10)/{CoMnGe(20)/Cu(2)/CoMnGe(20) (CoMnGe – Total = 40 Å) | 2 | ↑ | ↑ |
| 27 | 40FeCo(10)/{CoMnGe(14)/Cu(2)} × 2/CoMnGe(12) (CoMnGe – Total = 40 Å) | 3 | ↑ | ↑ |
| 28 | 40FeCo(10)/{CoMnGe(10)/Cu(2)} × 3/CoMnGe(10) (CoMnGe – Total = 40 Å) | 4 | ↑ | ↑ |
| 29 | 40FeCo(10)/{CoMnGe(8)/Cu(2)} × 4/CoMnGe(8) (CoMnGe – Total = 40 Å) | 5 | ↑ | ↑ |

The composition ratio of a CoMnGe layer (magnetic layer) of each of the second fixed magnetic layers 4c and 8c was set in each of the samples 18 to 23 shown in Table 4 so as to satisfy the relationship of Co; 50 (at. %), Mn; 26 (at. %), and Ge; 24 (at. %), and each of the non-magnetic material layers 5 and 7 interposed between each of the second fixed magnetic layers 4c and 8c and the free magnetic layer 6 is formed of Cu with a thickness of 43 Å.

The composition ratio of a CoMnGe layer (magnetic layer) of each of the second fixed magnetic layers 4c and 8c in each of the samples 24 to 29 shown in Table 4 was set so as to satisfy the relationship of Co; 49 (at. %), Mn; 26 (at. %), and Ge; 25 (at. %), and each of the non-magnetic material layers 5 and 7 interposed between each of the second fixed magnetic layers 4c and 8c and the free magnetic layer 6 is formed of Cu with a thickness of 50 Å.

In addition, the free magnetic layer 6 of each of the samples 19 to 23 and 25 to 29 is formed with a laminated structure of a CoMnGe layer (magnetic layer) and a Cu layer (intermediate layer). In the meantime, in each of the samples 18 and 24, the free magnetic layer 6 is formed with a structure of a CoMnGe layer.

After a structure of a base substrate of each sample is formed, a heat treatment was performed. After the samples 19

Further, after the samples 25 to 29 are classified into a group B, in each of the samples 25 to 29 of the group B, a relationship between the number of CoMnGe layers included in each of the second fixed magnetic layers 4c and 8c and ΔRA, and a relationship between the number of CoMnGe layers included in each of the second fixed magnetic layers 4c and 8c and the ferromagnetic coupling magnetic field $H_{in}$ were investigated. In addition, ΔRA and the ferromagnetic coupling magnetic field $H_{in}$ in the sample 24 are also graphed.

Figure 13:
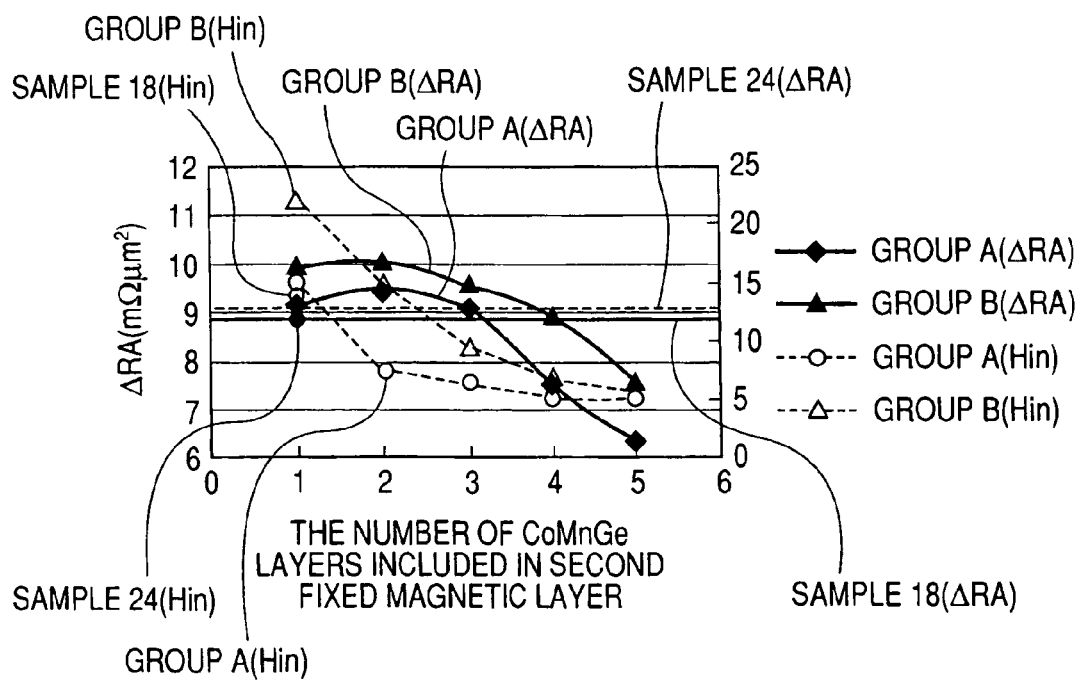
FIG. 13 is a graph illustrating a relationship between ΔRA and the number of magnetic layers (CoMnGe layers) included in a second fixed magnetic layer which is formed of a laminated structure of the magnetic layers and an intermediate layer (Cu) and a relationship between the number of the magnetic layers included in the second fixed magnetic layer and a ferromagnetic coupling magnetic field $H_{in}$.

First, ΔRA was considered. As shown in FIG. 13, it could be apprehended that the number of CoMnGe layers included in each of the second fixed magnetic layers 4c and 8c is preferably set within a range of 1 to 3 in order to obtain ΔRA larger than that of the sample 18 in the group A. In addition, it could be apprehended that the number of CoMnGe layers included in each of the second fixed magnetic layers 4c and 8c is preferably set within a range of 1 to 4 in order to obtain ΔRA larger than that of the sample 24 in the group B.

Next, the ferromagnetic coupling magnetic field $H_{in}$ was considered. As shown in FIG. 13, it could be apprehended that the number of CoMnGe layers included in each of the second fixed magnetic layers 4c and 8c is preferably set to two or more in order to obtain the ferromagnetic coupling magnetic field $H_{in}$ weaker than that of the sample 18 in the group A. In addition, it could be apprehended that the number of CoMnGe layers included in each of the second fixed magnetic layers 4c and 8c is preferably set to three or more in order to obtain the ferromagnetic coupling magnetic field $H_{in}$ weaker than that of the sample 24 in the group B. From the above-mentioned result, it could be apprehended that when the second fixed magnetic layers 4c and 8c are formed, the number of CoMnGe layers is preferable within a range of 2 to 4 in that ΔRA can be increased and the ferromagnetic coupling magnetic field $H_{in}$ can be decreased.

In addition, from the respective experiments, it could be apprehended that it is preferable that when the free magnetic layer 6 is formed with a laminated structure of the magnetic layer and the intermediate layer, the intermediate layer (Cu) is formed with a thickness of about 1 Å to 6 Å, the magnetic layer (CoMnGe) is formed with a thickness of about 10 Å to 35 Å, and the number of the magnetic layers is adjusted to about 3 to 8.

In the meantime, it could be apprehended that it is preferable that when each of the second fixed magnetic layers 4c and 8c is formed with a laminated structure of the magnetic layer and the intermediate layer, the intermediate layer (Cu) is formed with a thickness of about 1 Å to 6 Å, the magnetic layer (CoMnGe) is formed with a thickness of about 10 Å to 20 Å, and the number of the magnetic layers is adjusted to about 2 to 4.

As a result, the composition ratio d of the element α contained in the magnetic alloy layer, which is formed in the free magnetic layer 6 or each of the second fixed magnetic layers 4c and 8c and whose composition formula is represented as as $X_aY_bZ_c\alpha_d$, could be properly adjusted within a range which is greater than 0 at. % and not more than 17.5 at. %. Therefore, it could be apprehended that it is possible to manufacture a magnetic detecting device in which ΔRA is large and the ferromagnetic coupling magnetic field $H_{in}$ is weak.

The invention claimed is:

1. A magnetic detecting device comprising:
   fixed magnetic layers whose magnetization direction is fixed; and
   a free magnetic layer which is formed between the fixed magnetic layers via non-magnetic material layers and whose magnetization direction varies by an external magnetic field,
   wherein at least one of the fixed magnetic layers and the free magnetic layer have a magnetic alloy layer whose composition formula is represented as $X_aY_bZ_c\alpha_d$,
   a composition ratio d of the element α is within a range which is greater than 0 at. % and not more than 17.5 at. %,
   the element X is at least one element selected from a group consisting of Co, Rh, Pt, Au, Pd, Ir, Ru, Ag, Zn, Cd, and Fe,
   the element Y is at least one element selected from a group consisting of Mn, Fe, Ti, V, Zr, Nb, Hf, Ta, Cr, and Co,
   the element Z is at least one element selected from a group consisting of Al, Sn, In, Sb, Ga, Si, Ge, Pb, and Zn,
   the element α is at least one of Cu or Ni, and
   a, b, c, and d indicate average composition ratios (at. %) in the magnetic alloy layer and satisfy a relationship of a+b+c+d=100 at. %.

2. The magnetic detecting device according to claim 1, wherein the composition ratio d of the element α is within a range of 5.0 to 15.0 at. %.

3. The magnetic detecting device according to claim 1, wherein a composition of the element α is varied in a film thickness direction of the magnetic alloy layer.

4. The magnetic detecting device according to claim 3, wherein the composition ratio of the element α contained in the magnetic alloy layer is larger than that of both a top surface and a bottom surface of the magnetic alloy layer.

5. The magnetic detecting device according to claim 3, wherein the composition ratio of the element α alternately increases and decreases toward a top surface of the magnetic alloy layer from a bottom surface.

6. The magnetic detecting device according to claim 1, wherein the composition ratios a, b, and c satisfy a relationship of 2:1:1.

7. The magnetic detecting device according to claim 6, wherein the magnetic alloy layer is a $(Co_2MnGe)_bCu_d$ layer.

8. The magnetic detecting device according to claim 1, wherein the magnetic alloy layer is formed on the interface which comes into contact with at least the non-magnetic material layers.

9. The magnetic detecting device according to claim 1, wherein the fixed magnetic layers are formed as a laminated structure of a first fixed magnetic layer, a non-magnetic intermediate layer, and a second fixed magnetic layer, respectively, the second fixed magnetic layer coming into contact with the non-magnetic material layer,
the second fixed magnetic layer is formed as a laminated structure of a non-magnetic intermediate layer-side magnetic layer and a non-magnetic material layer-side magnetic layer, and
the non-magnetic material layer-side magnetic layer is formed as the magnetic alloy layer.

10. The magnetic detecting device according to claim 1, further comprising:
   antiferromagnetic layers that are provided at the sides of the fixed magnetic layers opposite to the non-magnetic material layers so as to fix the magnetization direction of each of the fixed magnetic layers by means of an exchange coupling anisotropy magnetic field generated between the antiferromagnetic layer and the fixed magnetic layer.

11. The magnetic detecting device according to claim 1, further comprising:
   non-magnetic material layers which are laminated over and under the free magnetic layer, respectively; and
   fixed magnetic layers which are provided over a first of the non-magnetic material layers and under a second of the non-magnetic material layers, respectively.

12. The magnetic detecting device according to claim 11, wherein the antiferromagnetic layers are provided over the first fixed magnetic layer and under the second fixed magnetic layer, respectively and fix the magnetization direction of each of the fixed magnetic layers to a predetermined direction by means of the exchange anisotropy magnetic field.

13. The magnetic detecting device according to claim 1, wherein the fixed magnetic layers, the non-magnetic material layers, and the free magnetic layer are formed so as to flow a sense current in a direction perpendicular to a surface thereof.

14. A method of manufacturing a magnetic detecting device comprising forming fixed magnetic layers whose magnetization direction is fixed, and a free magnetic layer which is formed between the fixed magnetic layers via non-magnetic material layers and whose magnetization direction varies by an external magnetic field,
   wherein at least a portion of the at least one of the fixed magnetic layers or the free magnetic layer is formed as a magnetic alloy layer whose composition formula is represented as $X_aY_bZ_c\alpha_d$ and whose a composition ratio d of the element α is within a range which is greater than 0 at. % and not more than 17.5 at. %, the element X is at least one element selected from a group consisting of Co, Rh, Pt, Au, Pd, Ir, Ru, Ag, Zn, Cd and Fe, the element Y is at least one element selected from a group consisting of Mn, Fe, Ti, V, Zr, Nb, Hf, Ta, Cr, and Co, the element Z is at least one element selected from a group consisting of Al, Sn, In, Sb, Ga, Si, Ge, Pb, and Zn, the element α is at least one of Cu or Ni, and a, b, c, and d indicate average composition ratios (at. %) in the magnetic alloy layer and satisfy a relationship of a+b+c+d=100 at. %.

15. The method of manufacturing the magnetic detecting device according to claim 14, wherein the magnetic alloy layer is formed by providing a laminated structure in which intermediate layers containing the element α are interposed among a plurality of magnetic layers each of which the composition formula is represented as $X_2YZ$ or XYZ.

16. The method of manufacturing the magnetic detecting device according to claim 15, wherein the intermediate layers are formed with a thickness of 1 Å to 6 Å, respectively.

17. The method of manufacturing the magnetic detecting device according to claim 15, wherein when the free magnetic layer is formed with a laminated structure of the magnetic layers and the intermediate layers, each of the magnetic layers is formed with a thickness of 10 Å to 35 Å, and the number of the magnetic layers is within a range of 3 to 8.

18. The method of manufacturing the magnetic detecting device according to claim 15, wherein the fixed magnetic layers are formed as a laminated structure of a first fixed magnetic layer, a non-magnetic intermediate layer, and a second fixed magnetic layer, respectively, the second fixed magnetic layer and the non-magnetic material layer coming into contact with each other, the second fixed magnetic layer is formed as a non-magnetic intermediate layer-side magnetic layer and a non-magnetic material layer-side magnetic layer, and when the non-magnetic material layer-side magnetic layer is formed as a magnetic alloy layer having the laminated structure of the magnetic layers and the intermediate layers, each of the magnetic layers is formed with a thickness of 10 Å to 20 Å, and the number of the magnetic layers is within a range of 2 to 4.

19. The method of manufacturing the magnetic detecting device according to claim 15, wherein after forming the laminated structure of the magnetic layers and the intermediate layers, a heat treatment is performed.

* * * * *